US012107143B2

(12) United States Patent
Radic et al.

(10) Patent No.: US 12,107,143 B2
(45) Date of Patent: Oct. 1, 2024

(54) SEMICONDUCTOR DEVICE WITH EXTRINSIC BASE REGION AND METHOD OF FABRICATION THEREFOR

(71) Applicant: NXP B.V., Eindhoven (NL)

(72) Inventors: Ljubo Radic, Gilbert, AZ (US); Johannes Josephus Theodorus Marinus Donkers, Valkenswaard (NL); Bernhard Grote, Phoenix, AZ (US)

(73) Assignee: NXP B.V., Eindhoven (NL)

( * ) Notice: Subject to any disclaimer, the term of this patent is extended or adjusted under 35 U.S.C. 154(b) by 217 days.

(21) Appl. No.: 17/813,504

(22) Filed: Jul. 19, 2022

(65) Prior Publication Data

US 2024/0030308 A1 Jan. 25, 2024

(51) Int. Cl.
*H01L 29/66* (2006.01)
*H01L 29/10* (2006.01)
*H01L 29/737* (2006.01)

(52) U.S. Cl.
CPC .... *H01L 29/66242* (2013.01); *H01L 29/1004* (2013.01); *H01L 29/7375* (2013.01); *H01L 29/7378* (2013.01)

(58) Field of Classification Search
CPC .......... H01L 29/66242; H01L 29/1004; H01L 29/7375; H01L 29/7378; H01L 29/0649; H01L 29/0821; H01L 29/7371
See application file for complete search history.

(56) References Cited

U.S. PATENT DOCUMENTS

| | | | |
|---|---|---|---|
| 5,134,454 A | 7/1992 | Neudeck et al. | |
| 6,870,184 B2 | 3/2005 | Li et al. | |
| 7,074,685 B2 | 7/2006 | Magnee et al. | |
| 8,431,966 B2 | 4/2013 | Meunier-Beillard et al. | |
| 8,786,051 B2 | 7/2014 | Adkisson et al. | |
| 9,111,986 B2 | 8/2015 | Camillo-Castillo et al. | |
| 9,240,448 B2 | 1/2016 | Adkisson et al. | |
| 2008/0050883 A1 | 2/2008 | Enicks | |
| 2011/0304019 A1* | 12/2011 | Meunier-Beillard | H01L 29/7378 257/E29.174 |
| 2013/0214275 A1* | 8/2013 | Adkisson | H01L 29/732 438/318 |
| 2014/0246676 A1 | 9/2014 | Camillo-Castillo et al. | |
| 2015/0194510 A1 | 7/2015 | Camillo-Castillo et al. | |
| 2018/0102422 A1 | 4/2018 | Stamper et al. | |

* cited by examiner

*Primary Examiner* — Syed I Gheyas
(74) *Attorney, Agent, or Firm* — Andrew C. Milhollin

(57) ABSTRACT

A semiconductor device, such as a heterojunction bipolar transistor (HBT), may include an extrinsic base region that is connected to a collector region via semiconductor material formed in an opening in one or more dielectric layers interposed between the extrinsic base region and the collector region. The extrinsic base region may be formed from monocrystalline semiconductor material, such as silicon or silicon germanium, via selective epitaxial growth. An intrinsic base region may be formed adjacent to the extrinsic base region and may be interposed directly between the collector region and an intrinsic emitter region. A HBT with such an arrangement may have reduced base-collector capacitance and reduced base resistance compared to some conventional HBTs.

18 Claims, 38 Drawing Sheets

SEMICONDUCTOR DEVICE WITH EXTRINSIC BASE REGION AND METHOD OF FABRICATION THEREFOR

TECHNICAL FIELD

Embodiments of the subject matter described herein relate generally to transistor devices, including bipolar junction transistors (BJTs) and heterojunction bipolar transistors (HBTs).

BACKGROUND

Semiconductor devices find application in a wide variety of electronic components and systems. Moreover, useful semiconductor devices for radio frequency (RF), microwave, and millimeter wave applications may include BJTs, HBTs, and related devices. In particular, HBTs are useful in high frequency applications because of their fast transit time, high cutoff frequency, high gain, and good linearity properties. These HBTs act as active gain elements and find applications as active devices in RF, microwave, and millimeter wave power amplifiers, oscillators, and other useful electronic components.

SUMMARY

A brief summary of various exemplary embodiments is presented below. Some simplifications and omissions may be made in the following summary, which is intended to highlight and introduce some aspects of the various exemplary embodiments, without limiting the scope. Detailed descriptions of an exemplary embodiment adequate to allow those of ordinary skill in the art to make and use these concepts will follow in later sections.

In an example embodiment, a method may include steps of forming a first dielectric layer over a substrate that includes an isolation region and a collector region of a transistor device, forming an opening in the first dielectric layer to expose a portion of an upper surface of the collector region, forming a monocrystalline semiconductor layer over the first dielectric layer and in the opening, forming a second dielectric layer and a third dielectric layer over the monocrystalline semiconductor layer, removing a first portion of the monocrystalline semiconductor layer and portions of the first, second, and third dielectric layers, forming an intrinsic base region of the transistor device by forming first semiconductor material over the collector region, forming an emitter region of the transistor device by forming second semiconductor material over the intrinsic base region and a portion of the extrinsic base region. The first portion may overlap the collector region prior to removal of the first portion, and an extrinsic base region of the transistor device may include a second portion of the monocrystalline semiconductor layer.

In one or more embodiments, forming the monocrystalline semiconductor layer may include forming third semiconductor material over the first dielectric layer and in the opening, amorphizing the first semiconductor material to form an amorphized semiconductor layer, performing epitaxial regrowth of the amorphized semiconductor layer to produce the monocrystalline semiconductor layer, and increasing a thickness of the monocrystalline semiconductor layer via epitaxial growth.

In one or more embodiments, forming the intrinsic base region may include forming a launcher layer of fourth semiconductor material over the collector region adjacent to the first dielectric layer and forming the first semiconductor material on the launcher layer.

In one or more embodiments, the first semiconductor material on the launcher layer may include forming the first semiconductor material on the launcher layer via selective epitaxial growth.

In one or more embodiments, forming the first semiconductor material on the launcher layer may include forming the first semiconductor material on the launcher layer via non-selective epitaxial growth.

In one or more embodiments, forming the emitter region may include forming a cap layer on the first semiconductor material via epitaxial growth, and forming the second semiconductor material on the cap layer and the third dielectric layer. The second semiconductor material may include a monocrystalline portion formed on the cap layer and a polycrystalline portion formed on the third dielectric layer.

In one or more embodiments, the method may further include a step of forming an inside spacer over a portion of the cap layer and adjacent to the second and third dielectric layers, wherein the inside spacer comprises one or more layers of dielectric material separating the cap layer and the second dielectric layer from the polycrystalline portion of the second semiconductor material of the emitter region.

In one or more embodiments, the extrinsic base region may be coupled to the collector region through the opening in the first dielectric layer.

In one or more embodiments, the substrate further includes an additional isolation region that separates the collector region into first and second portions. The first portion of the collector region may be coupled to the extrinsic base region and the second portion of the collector region is coupled to the intrinsic base region.

In one or more embodiments, the opening may be defined by substantially vertical sidewalls of the first dielectric layer.

In one or more embodiments, the extrinsic base region may include a silicon germanium superlattice.

In an example embodiment, a transistor device may include a substrate that includes a collector region and an isolation region, a first dielectric layer disposed over the substrate, an extrinsic base region disposed over the first dielectric layer, the extrinsic base region including monocrystalline semiconductor material, the extrinsic base region coupled to the collector region via an opening in the first dielectric layer, an intrinsic base region disposed adjacent to the extrinsic base region and over the collector region, and an emitter region disposed over the intrinsic base region.

In one or more embodiments, the transistor device may further include a second dielectric layer disposed over the extrinsic base region, and a third dielectric layer disposed over the second dielectric layer.

In one or more embodiments, the emitter region may include an intrinsic emitter region that is disposed on the intrinsic base region and that is formed from monocrystalline semiconductor material and an extrinsic emitter region that is disposed on the third dielectric layer and adjacent to the intrinsic emitter region and that is formed from polycrystalline semiconductor material.

In one or more embodiments, the extrinsic base region may be formed from monocrystalline silicon, the intrinsic base region may be formed from monocrystalline silicon germanium, the intrinsic emitter region may be formed from monocrystalline silicon, and the extrinsic emitter region may be formed from polycrystalline silicon.

In one or more embodiments, the transistor device may further include an inside spacer comprising one or more dielectric layers that separate the extrinsic emitter region from the second dielectric layer.

In one or more embodiments, the transistor device may further include a cap layer disposed between the intrinsic base region and the emitter region.

In one or more embodiments, the transistor device may further include a launcher layer formed from monocrystalline semiconductor material and disposed between the collector region and the intrinsic base region.

In one or more embodiments, the opening may be defined by substantially vertical sidewalls of the first dielectric layer.

In one or more embodiments, the substrate may further include an additional isolation structure that divides the collector region into first and second portions. The first portion of the collector region may be coupled to the extrinsic base region via the opening in the first dielectric layer and the second portion of the collector region is coupled to the intrinsic base region.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

FIGS. 22-28 are cross sectional views depicting a transistor device at various stages of fabrication corresponding to, for example, the method of FIG. 22, in accordance with various embodiments.

DETAILED DESCRIPTION

Various embodiments described herein address the above challenges by providing a transistor, such as a heterojunction bipolar transistor (HBT) and an associated fabrication method in which an extrinsic base region of the transistor is formed from monocrystalline silicon. Conventional HBT structures typically include a polycrystalline silicon (sometimes referred to as polysilicon) extrinsic base region. However, polycrystalline silicon has higher resistivity than monocrystalline silicon, such that using a polycrystalline silicon base region results in higher resistance between the base electrode of the HBT and the intrinsic base region of the HBT (sometimes referred to herein as the "base resistance" or denoted as "Rb"). In order to reduce this resistance such conventional HBTs sometimes include polycrystalline silicon base regions that are heavily doped. However, high dopant diffusivity in polycrystalline Silicon may result in dopants reaching monocrystalline regions of the HBT, which may undesirably increase the base-collector junction capacitance (sometimes denoted herein as "Cbc"). One or more embodiments described herein relate to an HBT transistor having a monocrystalline extrinsic base region, which is comparatively less resistive than an otherwise similar polycrystalline extrinsic base region would be (due to higher carrier mobility), advantageously resulting in a lower Rb for the HBT.

In one or more embodiments, the monocrystalline extrinsic base region may be at least partially separated from the collector region of the HBT by one or more dielectric layers (e.g., including one or more oxide layers, nitride layers, or other layers of applicable dielectric material). This may reduce the capacitive coupling between the extrinsic base region and the collector region. In one or more embodiments, these dielectric layers may cause capacitive coupling between the intrinsic base region and the intrinsic collector region being the dominant component of the Cbc of the HBT. For example, higher doping concentrations may be used when doping the collector region of the HBT in such embodiments. Increasing the doping concentration of the collector region may reduce collector resistance and increase fT/fMax, where fT is the unit gain frequency (i.e., the frequency at which the gain of the transistor is 1) and fMax is the highest oscillating frequency of the transistor. If the thickness of a launcher layer (e.g., a layer of monocrystalline semiconductor material disposed between the collector region and the intrinsic base region) of the HBT is increased in addition to increasing the doping concentration of the collector region, the same or higher collector-base breakdown voltage (BVcbo) may be achieved while maintaining a comparatively lower collector resistance.

Figure 1:
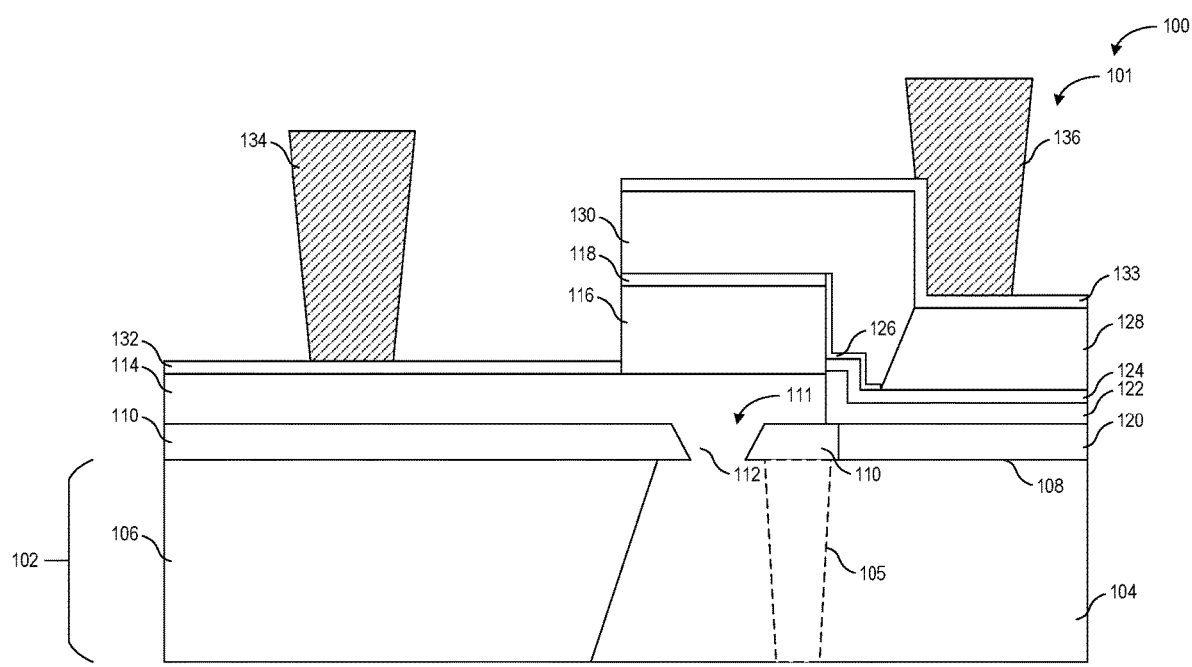
FIG. 1 is a cross sectional side view of a transistor device, in accordance with various embodiments.

FIG. 1 is a cross-sectional side view 100 of a transistor device 101, according to an embodiment. The transistor device 101 may include a base substrate 102 that includes at least a collector region 104 and an isolation region 106. The base substrate 102 may include one or more regions of semiconductor material (e.g., the collector region 104), where such regions of semiconductor material may include one or more of silicon (Si), germanium (Ge), silicon germanium (SiGe), gallium arsenide (GaAs), gallium phosphide (GaP), indium gallium phosphide (InGaP), indium phosphide (InP), gallium nitride (GaN), aluminum nitride (AlN), indium nitride (InN), silicon carbide (SiC), sapphire, or other suitable materials. In some embodiments, one or more regions of semiconductor material (e.g., the collector region 104) of the base substrate 102 may include semiconductor regions that are formed via ion implantation or that are grown via epitaxial growth. In one or more embodiments, the base substrate 102 may be a Silicon on Insulator (all) substrate that includes a buried oxide layer disposed between a base silicon substrate and a top silicon layer.

It should be understood that only a portion of the base substrate 102 is shown in the present example. For example, elements that may be included in the base substrate 102 and that are not shown here may include additional semiconductor regions (as described above), backside metallization (e.g., a reference plane), and/or one or more metallized through-substrate vias.

In one or more embodiments, the transistor device 101 may be a heterojunction bipolar transistor (HBT) that includes the collector region 104, an intrinsic base region 122 that is formed over the collector region 104, an extrinsic base region 114 that is formed partially overlapping the collector region 104 and partially overlapping the isolation region 106, an intrinsic emitter region 128 formed over the intrinsic base region 122, and an extrinsic emitter region 130 formed partially over the intrinsic base region 122 and partially over the extrinsic base region 114. In one or more embodiments, the collector region 104, the intrinsic base region 122, the extrinsic base region 114, and the intrinsic and extrinsic emitter regions 128, 130 may include one or more of Si, Ge, SiGe, or silicon-germanium-carbon (SiGeC). In one or more other embodiments, the collector region 104, the intrinsic base region 122, the extrinsic base region 114, and the intrinsic and extrinsic emitter regions 128, 130 may include one or more of GaAs, GaN, AlN, InN, InGaP, and/or other suitable semiconductor materials.

In one or more embodiments, the transistor device 101 may be configured as a npn transistor such that the collector region 104 and the intrinsic and extrinsic emitter regions 128, 130 include n-type semiconductor material and the intrinsic base region 122 and the extrinsic base region 114 may each include p-type semiconductor material. In other embodiments, the transistor device 101 may be configured as a pnp transistor such that the collector region 104 and the intrinsic and extrinsic emitter regions 128, 130 may include a p-type semiconductor and the intrinsic base region 122 and the extrinsic base region 114 may each include n-type semiconductor material. As used herein, the term "n-type semiconductor material" refers to a semiconductor material with a net electron concentration ranging from about $1e15$ $cm^{-3}$ to about $1e21$ $cm^{-3}$, though other higher or lower electron concentrations may be used. As used herein, the term "p-type semiconductor material" refers to a semiconductor material with a net hole concentration ranging from about $1e15$ $cm^{-3}$ to about $1e21$ $cm^{-3}$, though other higher or lower hole concentrations may be included.

In one or more embodiments, the collector region 104 may have a total thickness of between around 1,000 angstroms and around 3,000 angstroms. In one or more embodiments, the collector region 104 may have a total thickness of between around 100 angstroms and around 10,000 angstroms, though other thicknesses may be used. For embodiments in which the collector region 104 includes n-type semiconductor material (e.g., embodiments in which the transistor device 101 is a npn transistor), the collector region 104 may be doped with one or more of phosphorous (P), arsenic (As), antimony (Sb), lithium (Li), or other suitable dopants. For embodiments in which the collector region 104 includes p-type semiconductor material (e.g., embodiments in which the transistor device 101 is a pnp transistor), the collector region 104 may be doped with one or more of carbon (C), boron (B), oxygen (O), or indium (In) or other suitable dopants.

In one or more embodiments, regardless of the dopant type (n-type or p-type) of the collector region 104, at least a portion of the collector region 104 may be doped to have a dopant concentration of between about $5e18$ $cm^{-3}$ and about $5e20$ $cm^{-3}$, although other higher or lower dopant concentrations may be used. In one or more embodiments, the collector region 104 may include multiple doped regions, each having respectively different doping concentrations (e.g., within the previously described range of dopant concentrations or another suitable range of dopant concentrations). The collector region 104 may be coupled to a collector electrode (not shown).

The isolation region 106 may be disposed laterally adjacent to the collector region 104, such that a sidewall (i.e., side surface) of the isolation region 106 is in direct contact with a sidewall (i.e., side surface) of the collector region 104. In one or more embodiments, the isolation region 106 may include one or more of silicon dioxide, tetra-ethyl orthosilicate (TEOS), silicon nitride (SiN), silicon oxynitride (SiON), aluminum oxide ($Al_2O_3$), aluminum nitride (AlN), spin-on glass, or other suitable dielectric material(s).

In one or more embodiments, an additional isolation region 105 may be disposed in the collector region 104. The additional isolation region 105 may include one or more of $SiO_2$, TEOS, SiN, SiON, $Al_2O_3$, AlN, spin-on glass, or other suitable dielectric material(s). For example, the additional isolation region 105 may divide the collector region 104 into two separate portions, with a first portion of the collector region 104 being coupled to the extrinsic base region 114 via the region 112 and the second portion of the collector region 104 being coupled to the intrinsic base region 122 via a launcher layer 120. The additional isolation region 105 may provide physical separation between the second portion of the collector region 104 (i.e., sometimes referred to as the "intrinsic" collector region) and each of the first portion of the collector region 104 and the extrinsic base region 114, which may mitigate damage to the second portion of the collector region 104 that may otherwise occur due to, for instance, amorphization implantation (e.g., step 210 of the method 200 of FIG. 2). By isolating the second portion of the collector region 104 using the additional isolation region 105 in this way, the respective impacts of diffusion and leakage current on the performance of the transistor device 101 may be advantageously reduced.

The launcher layer 120 (sometimes referred to as a "semiconductor launcher layer 120) may be formed over the collector region 104. In one or more embodiments, the launcher layer 120 may include a low-doped (e.g., between around $1e16$ $cm^{-3}$ and about $5e19$ $cm^{-3}$, although other higher or lower dopant concentrations may be used) or undoped semiconductor material (e.g., silicon). The launcher layer 120 may have the same doping type (e.g., n-type or p-type) as the collector region 104, for embodiments in which the launcher layer 120 is doped. The launcher layer 120 may be configured to increase the velocity of electrons injected into the collector region 104 in some embodiments. In an embodiment, the launcher layer may be an undoped monocrystalline silicon layer that is epitaxially grown on the collector region 104.

An intrinsic base region 122 may be formed over the collector region 104 (e.g., epitaxially grown directly on the launcher layer 120). In one or more embodiments, the intrinsic base region is formed using $Si_{1-X}Ge_X$ where X is the Ge mole fraction. In an embodiment, one or more portions of the intrinsic base region 122 may have a narrower bandgap than the intrinsic emitter region 128 and the collector region 104. In an embodiment, the bandgap of the one or more portions of the intrinsic base region 122 may be adjusted by changes in the Ge mole fraction. In an embodiment, the Ge mole fraction, X, may vary between about 0.05 and about 0.3 though other larger or smaller values of X may be used. In an embodiment, the value of the Ge mole fraction may be constant throughout the intrinsic base region 122. In still other embodiments, the bandgap of the intrinsic base region 122 may be continuously graded. In these embodiments, the material of the intrinsic base region 122 (e.g., $Si_{1-X}Ge_X$) may be graded by forming an upper portion of the intrinsic base region 122 with a wider bandgap and continuously reducing to a narrower bandgap in a lower portion of the intrinsic base region 122.

In one or more embodiments, a SiGe:C collector-base spacer (not shown) may be formed between intrinsic base region 122 and the launcher layer 120. The SiGe:C collector-base spacer may be undoped. In one or more embodiments, a SiGe:C base-emitter spacer (not shown) may be formed on the intrinsic base region 122. The SiGe:C base-emitter spacer may be doped or may be undoped, according to various embodiments. In one or more embodiments, the intrinsic base region 122 may include boron-doped SiGe:C. In one or more such embodiments, any of the SiGe:C collector-base spacer, the SiGe:C base-emitter spacer, and the SiGe:C intrinsic base region 122 may have respective carbon content of around 0.1% and germanium content of around 30%. In such embodiments, the carbon content of the SiGe:C collector-base spacer, the SiGe:C base-emitter spacer, and/or the SiGe:C intrinsic base region 122 may prevent or reduce undesirable diffusion of dopant impurities out of the base region 122.

In one or more embodiments in which the transistor device 101 is a pnp transistor, the intrinsic base region 122 may include n-type semiconductor material, such as semiconductor material doped with P, As, Sb, Li, or another suitable n-type dopant. In one or more embodiments in which the transistor device 101 is a npn transistor, the intrinsic base region 122 may include p-type semiconductor material, such as semiconductor material doped with C, B, 0, In, or another suitable p-type dopant. The dopant concentration of the intrinsic base region 122 may be in a range of around $5e17\ cm^{-3}$ to $1e21\ cm^{-3}$, although higher or lower dopant concentrations may be used.

The extrinsic base region 114 may be formed over the base substrate 102. As shown in the present example, a first portion of the extrinsic base region 114 may be formed directly over the isolation region 106 and a second portion of the extrinsic base region 114 may be formed directly over the collector region 114. The extrinsic base region 114 may be formed from monocrystalline semiconductor material, such as monocrystalline silicon. In one or more embodiments in which the transistor device 101 is a pnp transistor, the extrinsic base region 114 may include n-type semiconductor material, such as semiconductor material doped with P, As, Sb, Li, or another suitable n-type dopant. In one or more embodiments in which the transistor device 101 is a npn transistor, the extrinsic base region 114 may include p-type semiconductor material, such as semiconductor material doped with C, B, O, In, or another suitable p-type dopant. The dopant concentration of the extrinsic base region 114 may be in a range of around $1e20\ cm^{-3}$ to $1e21\ cm^{-3}$, although higher or lower dopant concentrations may be used.

One or more dielectric layers 110 may be interposed between the extrinsic base region 114 and the base substrate 102. The dielectric layer(s) 110 may at least partially separate and electrically insulate the extrinsic base region 114 from the collector region 104. The extrinsic base region 114 may be coupled to the collector region 104 by a region 112 includes semiconductor material formed in an opening 111 in the dielectric layer(s) 110. The region 112 may be formed from monocrystalline semiconductor material (e.g., the same semiconductor material as that of the collector region 104 and the extrinsic base region 114). The extrinsic base region 114 may be disposed adjacent to the intrinsic base region 122. For example, a sidewall (i.e., side surface) of the extrinsic base region 114 may directly contact a sidewall (i.e., side surface) of the intrinsic base region 122. The extrinsic base region 114 may be coupled to a base electrode 134 via a contact layer 132, which may be formed using one or more of titanium-tungsten (TiW), titanium tungsten nitride (TiWN), tungsten silicide (WSi), cobalt silicide (CoSi), platinum silicide (PtSi), nickel platinum silicide (NiPtSi), or one or more other suitable material(s). The base electrode 134 may be formed from copper, aluminum, tungsten, or another suitable conductive material, for example.

The intrinsic emitter region 128 may be formed over the intrinsic base region 122. The extrinsic emitter region 130 may be formed partially over a portion of the intrinsic base region 122 and partially over a portion of the extrinsic base region 114. The extrinsic emitter region 130 may be adjacent to and directly in contact with the intrinsic emitter region 128. In one or more embodiments in which the transistor device 101 is a npn transistor, the intrinsic emitter region 128 and the extrinsic emitter region 130 may be formed using n-type semiconductor material, such as semiconductor material doped with one or more of P, As, Sb, Li, or another suitable n-type dopant. In one or more embodiments in which the transistor device 101 is a pnp transistor, the intrinsic emitter region 128 and the extrinsic emitter region 130 may be formed using p-type semiconductor material, such as semiconductor material doped with one or more of C, B, O, In, or another suitable p-type dopant. The respective dopant concentrations of the intrinsic emitter region 128 and the extrinsic emitter region 130 may be in a range of around $1e19\ cm^{-3}$ to $1e21\ cm^{-3}$, although higher or lower dopant concentrations may be used.

In one or more embodiments, the intrinsic emitter region 128 includes monocrystalline semiconductor material (e.g., monocrystalline silicon). In one or more embodiments, the extrinsic emitter region 130 includes polycrystalline semiconductor material (e.g., polycrystalline silicon). In one or more embodiments, the intrinsic emitter region 128 may have a thickness of between about 100 angstroms around 1000 angstroms. In one or more other embodiments, the intrinsic emitter region 128 may have a thickness of between about 50 angstroms around 5000 angstroms, though other thicknesses may be used.

The intrinsic and extrinsic emitter regions 128, 130 may be coupled to an emitter electrode 136 via a contact layer 133, which may be formed using one or more of TiW, TiWN, WSi, CoSi, PtSi, NiPtSi, or other suitable material(s). The emitter electrode 136 may be formed from copper, aluminum, tungsten, or another suitable conductive material, for example.

An oxide layer 116 may be formed on a portion of the top surface of the extrinsic base region 114. A nitride layer 118 may be formed directly on a top surface of the oxide layer 116. A portion of the extrinsic emitter region 130 may be formed directly on the nitride layer 118, such that the oxide layer 116 and the nitride layer 118 may be disposed directly between the extrinsic emitter region 130 and the extrinsic base region 114. Together, the oxide layer 116 and the nitride layer 118 may act as an "emitter spacer" that provides separation and electrical isolation between the extrinsic emitter region 130 and the extrinsic base region 114. In one or more other embodiments, an emitter spacer formed from one or more layers including one or more of $SiO_2$, TEOS, SiN, SiON, $Al_2O_3$, AlN, spin-on glass, or other suitable dielectric material(s) (e.g., in place of or in combination with the oxide layer 116 and/or the nitride layer 118).

An emitter cap layer 124 may be formed over (e.g., directly on) the intrinsic base region 122 and may be disposed beneath the intrinsic emitter region 128 and a portion of the extrinsic emitter region 130. The emitter cap layer 124 may form a portion of the emitter-base junction.

An inside spacer 126 may be disposed between the extrinsic emitter region 130 and each of the nitride layer 118, the oxide layer 116, and the emitter cap layer 124. The inside spacer 126 may include one or more dielectric layers and may provide electrical insulation between the emitter cap layer 124 and the extrinsic emitter region 130. In one or more embodiments, the inside spacer 126 includes multiple dielectric layers, such as an oxide-nitride-oxide (ONO) stack. In one or more other embodiments, the inside spacer 126 may be formed from one or more layers including one or more of $SiO_2$, TEOS, SiN, SiON, $Al_2O_3$, AlN, spin-on glass, or other suitable dielectric material(s).

In embodiments in which the extrinsic base region 114 is formed from monocrystalline semiconductor material, rather than a polycrystalline semiconductor material, the resistance of the extrinsic base region 114 is reduced, resulting in the base resistance, Rb, between the base conductor 134 and the intrinsic base region 122 being advantageously reduced. Because the monocrystalline extrinsic base region 114 has a monocrystalline region 112 providing a buffer that does not need to be highly doped, less dopant diffusion may occur, thereby reducing the impact of diffusion on the base-collector junction capacitance, Cbc. Because of the lower dopant diffusion associated with the monocrystalline extrinsic base region 114 through the monocrystalline region 112, the extrinsic component of the Cbc for the transistor device 101 is advantageously reduced (e.g., compared to conventional transistor devices with wide, heavily doped polycrystalline extrinsic base regions overlapping the intrinsic collector region, which is conventionally required to achieve adequately low base resistance, Rb). In one or more embodiments, the resistivity of the extrinsic base region 114 and the Cbc of the transistor device 101 may be further reduced by including one or more SiGe layers in the extrinsic base region 114 and/or by including a SiGe superlattice in the extrinsic base region 114.

In an embodiment, the extrinsic base region 114 includes monocrystalline silicon, the collector region includes monocrystalline silicon, the intrinsic base region 122 includes monocrystalline SiGe, the emitter cap layer 124 includes monocrystalline silicon, the intrinsic emitter region 128 includes monocrystalline silicon, and the extrinsic emitter region 130 includes polycrystalline silicon.

In embodiments in which the extrinsic base region 114 is partially separated from the collector region by the one or more dielectric layers 110, capacitive coupling between the extrinsic base region 114 and the collector region 104 (and, therefore, Cbc of the transistor device 101) may be reduced, compared to conventional transistor devices having comparatively little or no dielectric material disposed between the extrinsic base and the collector region. Reducing coupling between the extrinsic base region 114 and the collector region 104 in this way may allow higher doping concentrations in the collector region 104, which may advantageously reduce collector resistance and increase the fMax of the transistor device 101.

For example, one or more embodiments of the transistor device 101 may have a reduction in base resistance of around 18%, a reduction of extrinsic base resistance of around 70%, a reduction of base-collector capacitance of around 35%, and an increase in fMax of around 33% compared to a conventional transistor device having an extrinsic base region that directly contacts the collector region without any dielectric layers interposed therebetween and/or having a polycrystalline base region. In some conventional transistor devices, the intrinsic base region must be at least partially interposed between the extrinsic base region and the collector region (e.g., such that the extrinsic base region at least partially overlaps the intrinsic base region), where a greater amount of overlap between the intrinsic base region and the extrinsic base region corresponds to lower base resistance and higher Cbc, resulting in a tradeoff between base resistance and Cbc. In comparison, the intrinsic base region 122 of the transistor device 101 is not interposed between the extrinsic base region 114 and the collector region 114, thereby advantageously avoiding the trade-off between base resistance and Cbc.

Figure 2:
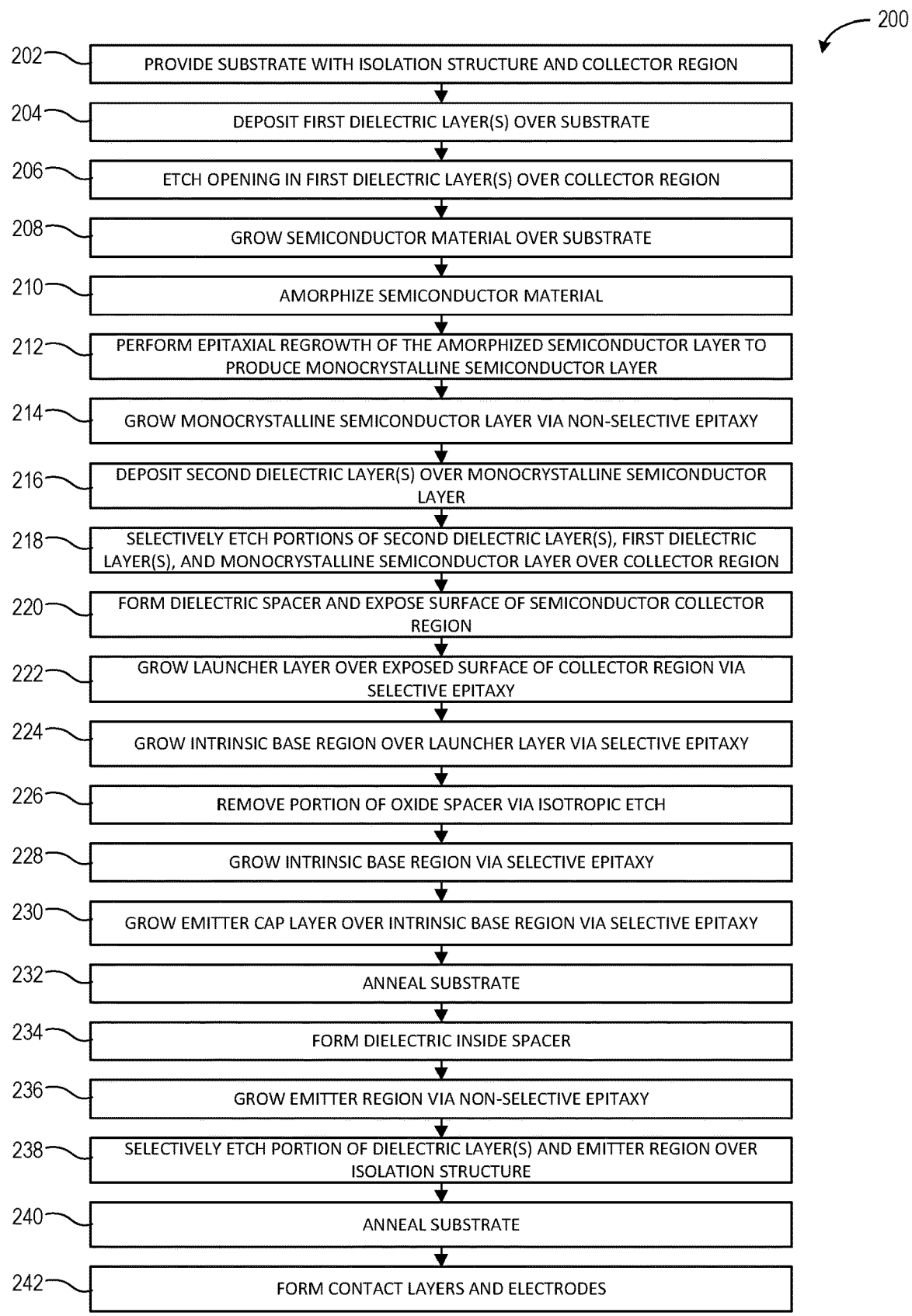
FIG. 2 is a process flow diagram describing a method for fabricating the transistor devices of FIG. 1, in accordance with various embodiments.

FIG. 2 is a process flow diagram depicting a method 200 for fabricating at least a portion of a transistor device, such as the transistor device 101 of FIG. 1, in accordance with various embodiments. For enhanced understanding, FIG. 2 may be viewed simultaneously with FIGS. 3-21, which are cross sectional views depicting the transistor device 101 of FIG. 1 at various stages of fabrication in accordance with various embodiments.

Figure 3:
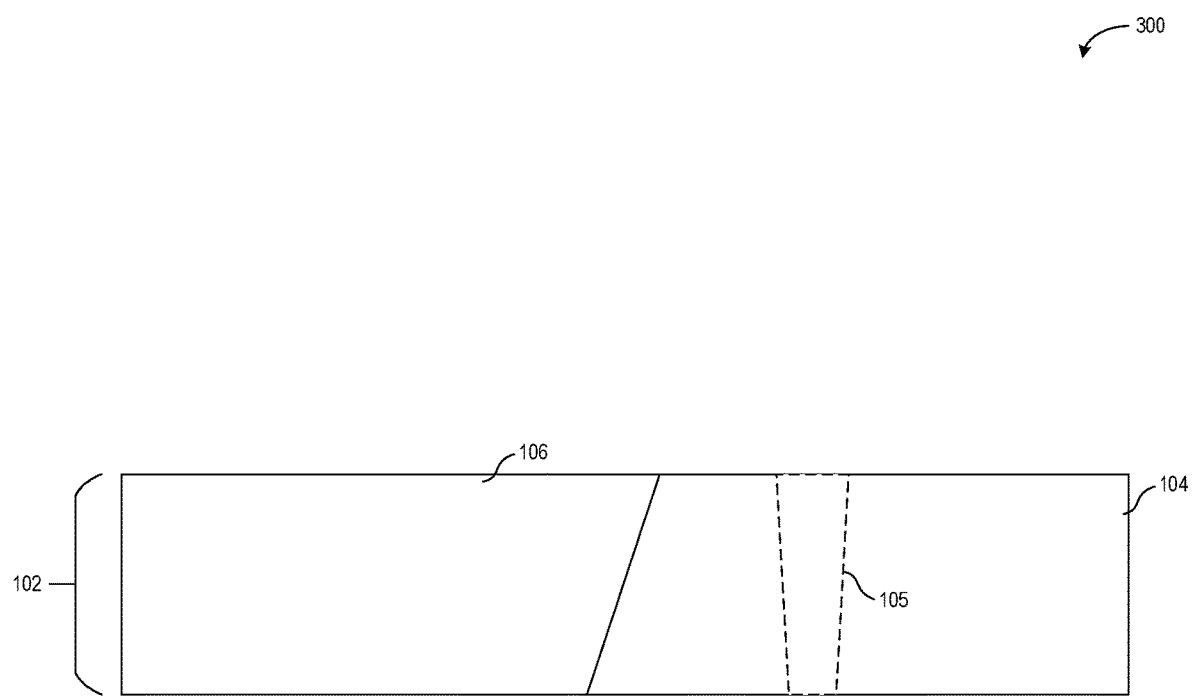
FIGS. 3-21 are cross sectional views depicting the transistor device of FIG. 1 at various stages of fabrication corresponding to, for example, the method of FIG. 2, in accordance with various embodiments.

Referring first to step 202 of FIG. 2 and to FIG. 3, at a stage of fabrication 300, a base substrate 102 is provided that includes a collector region 104 and an isolation region 106. As mentioned previously, the present example shows only a portion of the base substrate 102, and it should be understood that the base substrate 102 may include additional portions (e.g., additional portions of the collector region 104 and the isolation region 106, silicon-on-insulator (SOI), backside metallization, through-silicon vias, and/or the like) not illustrated here. At the stage of fabrication 300, the semiconductor material of the collector region 104 may already be doped with n-type dopant material or p-type dopant material, as mentioned above.

In one or more embodiments, the collector region 104 may be substantially contiguous in areas overlapped by the intrinsic base region 122 and the extrinsic base region 114. In one or more other embodiments, the collector region 104 may be at least partially divided into a first portion and a second portion by an additional isolation structure 105, with the first portion being coupled to the extrinsic base region 114 via the region 112 and the second portion being coupled to the intrinsic base region 122 via the launcher layer 120. The additional isolation region 105 may provide electrical insulation between the first portion and the second portion of the collector region 104.

Figure 4:
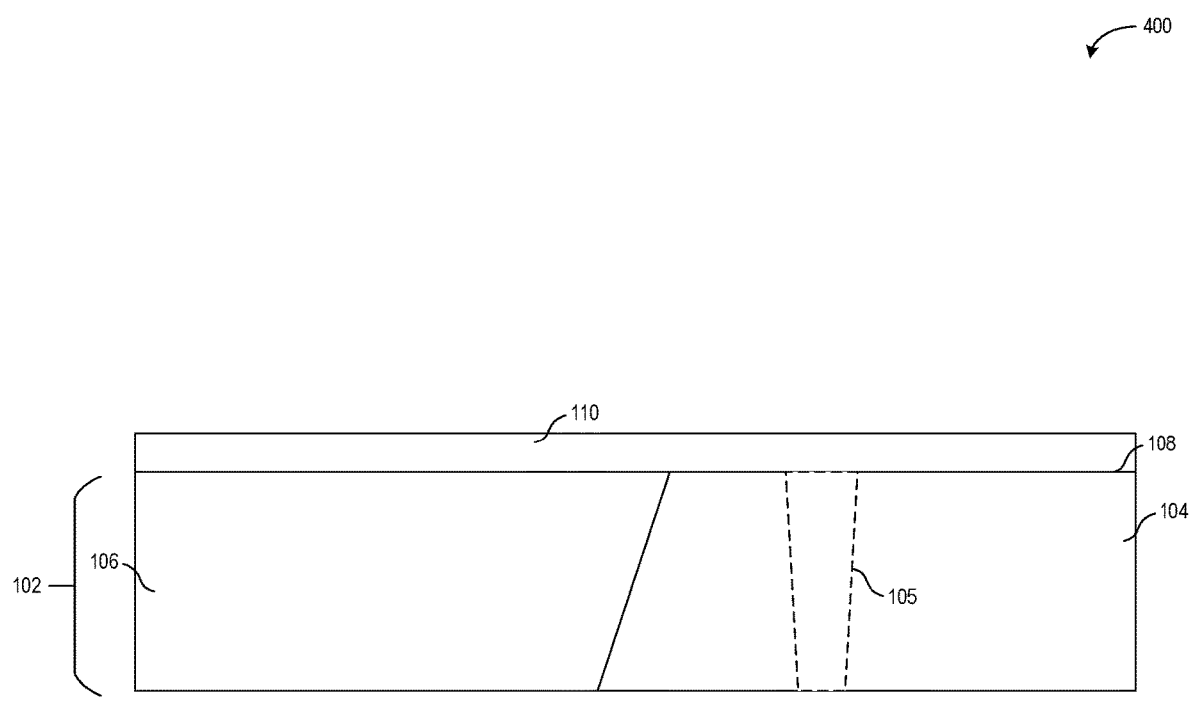

Referring next to step 204 of FIG. 2 and to FIG. 4, during a stage of fabrication 400, one or more dielectric layers 110 (i.e., "first dielectric layer(s)") may be formed on an upper surface 108 of the base substrate 102, covering the collector region 104 and the isolation region 106. In an embodiment, the dielectric layer(s) 110 may be formed by depositing a single TEOS layer on the upper surface 108. In another embodiment, the dielectric layer(s) 110 may be formed by depositing a TEOS layer on the upper surface 108 then depositing a nitride layer over the TEOS layer. In one or more other embodiments, the dielectric layer(s) 110 may be formed by depositing one or more layers of $SiO_2$, TEOS, SiN, SiON, $Al_2O_3$, AlN, spin-on glass, or other suitable dielectric material(s) on or over the upper surface 108.

Figure 5:
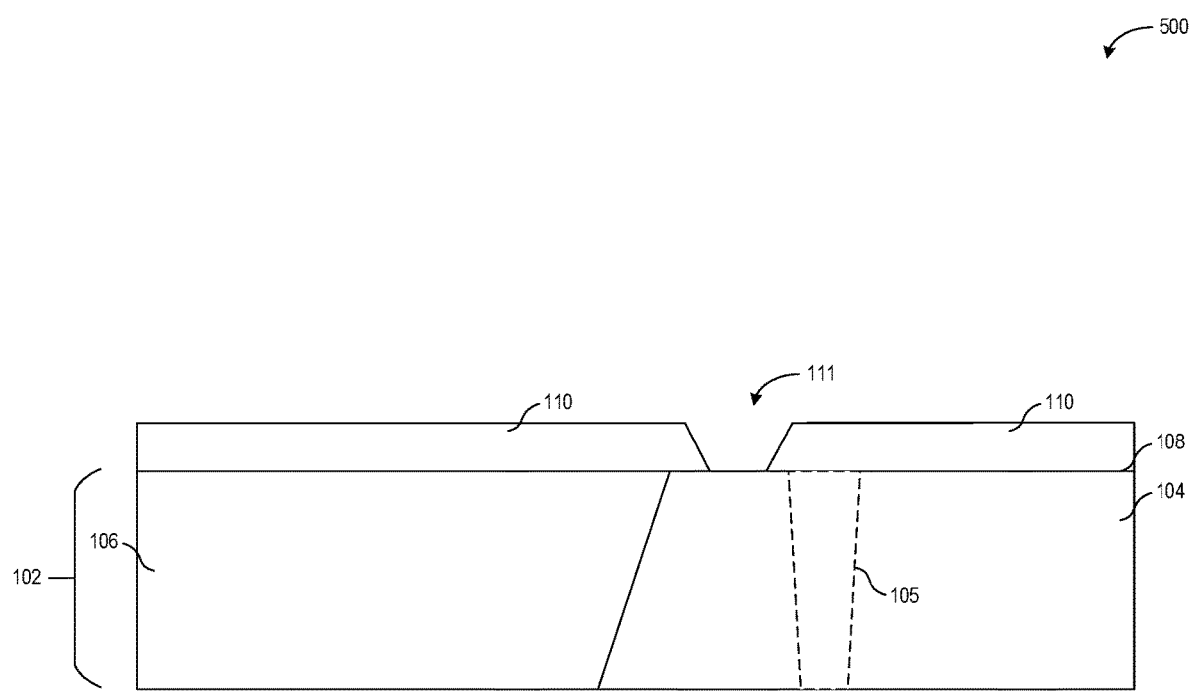

Referring next to step 206 of FIG. 2 and to FIG. 5, during a stage of fabrication 500, an opening 111 may be formed in the one or more dielectric layers 110, such that a portion of the upper surface 108 of the base substrate 102 (corresponding to an upper surface of the collector region 104) is exposed. In some embodiments, the opening 111 may be formed using one or more etch processes, which may include one or more wet chemical etches, reactive ion etches, or other suitable etch processes. For embodiments in which the one or more dielectric layers 110 include multiple dielectric layers formed from different respective dielectric materials with respectively different etch rates, multiple etch processes may be used to form the opening 111. For embodiments in which the one or more dielectric layers 110 include a single dielectric layer (e.g., oxide layer), a single etch process (e.g., an anisotropic or isotropic reactive ion etch process) may be used. In one or more embodiments, surfaces of the one or more dielectric layers 110 that are not being etched at the stage of fabrication 500 may be protected using patterned photoresist material, which may be removed upon completion of the etch process(es).

The opening 111 may be formed over the collector region 104, such that the exposed portion of the surface 108 corresponds to a surface of the collector region 104. In one or more embodiments, the opening 111 has substantially sloped sidewalls (e.g., around 5 to 30 degrees from being aligned normal to the upper surface 108). In one or more other embodiments, the opening 111 has substantially vertical sidewalls (e.g., less than 5 degrees of being aligned normal to the upper surface 108).

Figure 6:
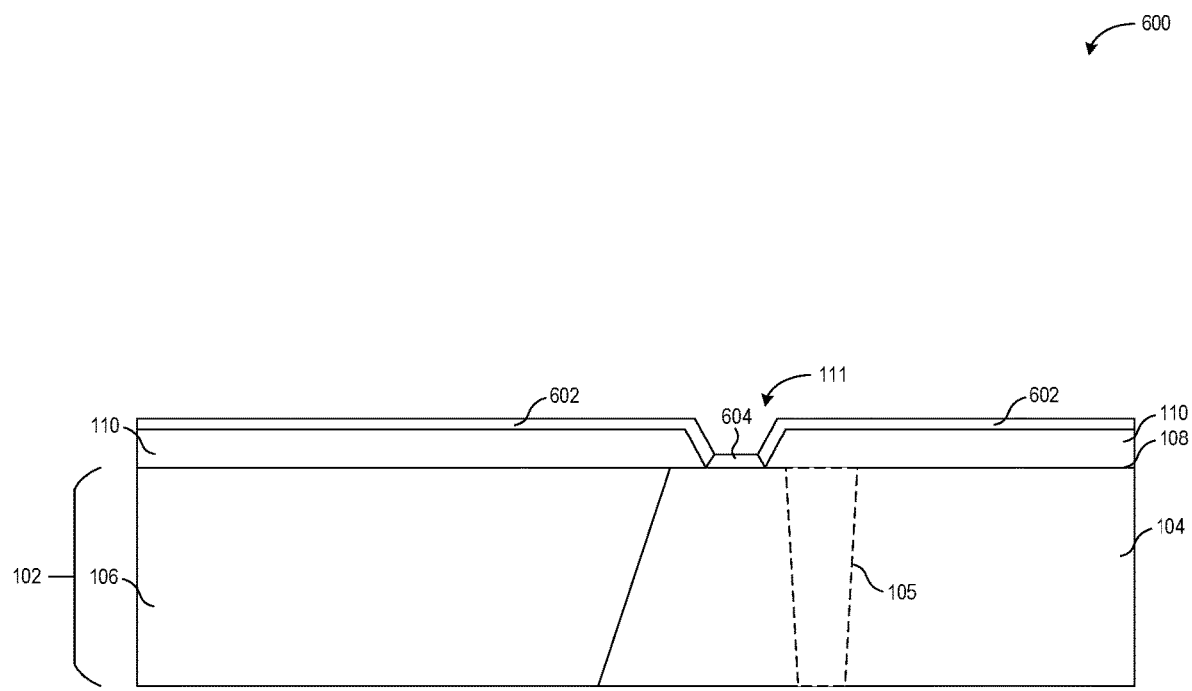

Referring next to step 208 of FIG. 2 and to FIG. 6, during a stage of fabrication 600, non-selective epitaxy is performed to grow semiconductor material (e.g., silicon as a non-limiting example) over the one or more dielectric layers 110 and in the opening 111. Herein, non-selective epitaxy of semiconductor material refers to a process by which semiconductor material is epitaxially grown on any exposed non-crystalline (e.g., amorphous) surface and any exposed crystalline surface (e.g., on both dielectric material and semiconductor material). Selective epitaxy of semiconductor material, for comparison, refers to a process in which the use of selective chemistry increases the seeding time of the semiconductor material on non-crystalline (e.g., amorphous) surfaces to such an extent that semiconductor material is, effectively, only grown on exposed crystalline surfaces and not on non-crystalline surfaces. For non-selective epitaxy, the semiconductor material that is grown on monocrystalline surfaces has a monocrystalline structure, and the semiconductor material that is grown on non-crystalline surfaces or polycrystalline surfaces has a polycrystalline structure.

In one or more embodiments, the semiconductor material grown via non-selective epitaxial growth at the stage of fabrication 600 includes a polycrystalline semiconductor layer 602 formed on surfaces of the one or more dielectric layers 110 (which are non-crystalline) and a monocrystalline semiconductor layer 604 formed on the exposed surface of the collector region 104 (which is monocrystalline, in the present example). The monocrystalline semiconductor material 604 is formed in the opening 111. Portions of the polycrystalline semiconductor layer 602 may extend onto the sidewalls that at least partially define the opening 111.

Figure 7:
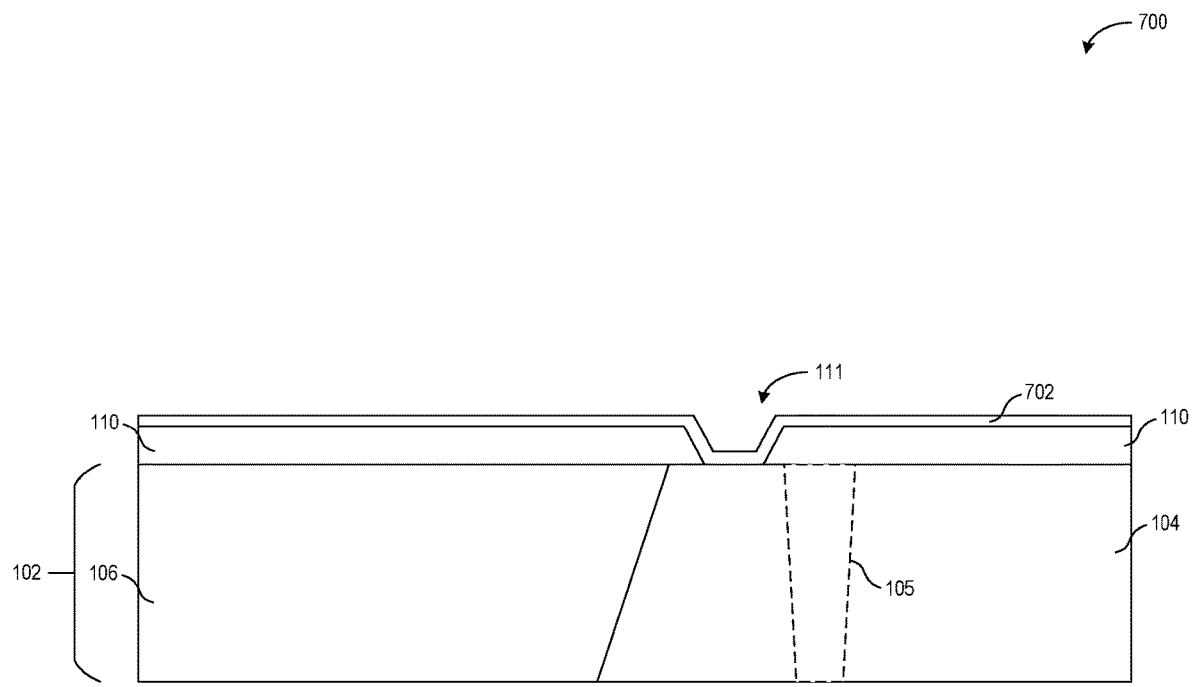

Referring next to step 210 of FIG. 2 and to FIG. 7, during a stage of fabrication 700, the semiconductor material deposited at step 208 and the stage of fabrication 600 (e.g., the polycrystalline semiconductor layer 602 and the monocrystalline semiconductor material 604) may be amorphized to form an amorphized semiconductor layer 702. In one or more embodiments, the amorphized semiconductor layer 702 may be formed via ion implantation of germanium (or, in one or more other embodiments, argon (Ar), Xenon (Xe), or tin (Sn)) in the polycrystalline semiconductor layer 602 and the monocrystalline semiconductor material 604, which may change the polycrystalline semiconductor layer 602 and the monocrystalline semiconductor material 604 from having respective polycrystalline and monocrystalline structures to having amorphous structures. For example, a dose of 1e15 cm$^{-2}$ of germanium may be implanted in the polycrystalline semiconductor material 602 and the monocrystalline semiconductor layer 604 to form the amorphized semiconductor layer 702.

When forming the amorphized semiconductor layer 702 via ion implantation, some ions may pass through the amorphized semiconductor layer 702 to one or more of the layers below the amorphized semiconductor layer 702, which may cause ion implantation damage in the collector region 104. However, in the present example, the one or more dielectric layers 110 may advantageously mitigate such ion implantation damage to the portions of the collector region 104 that are overlapped by the one or more dielectric layers 110 and not under the emitter region 128.

Figure 8:
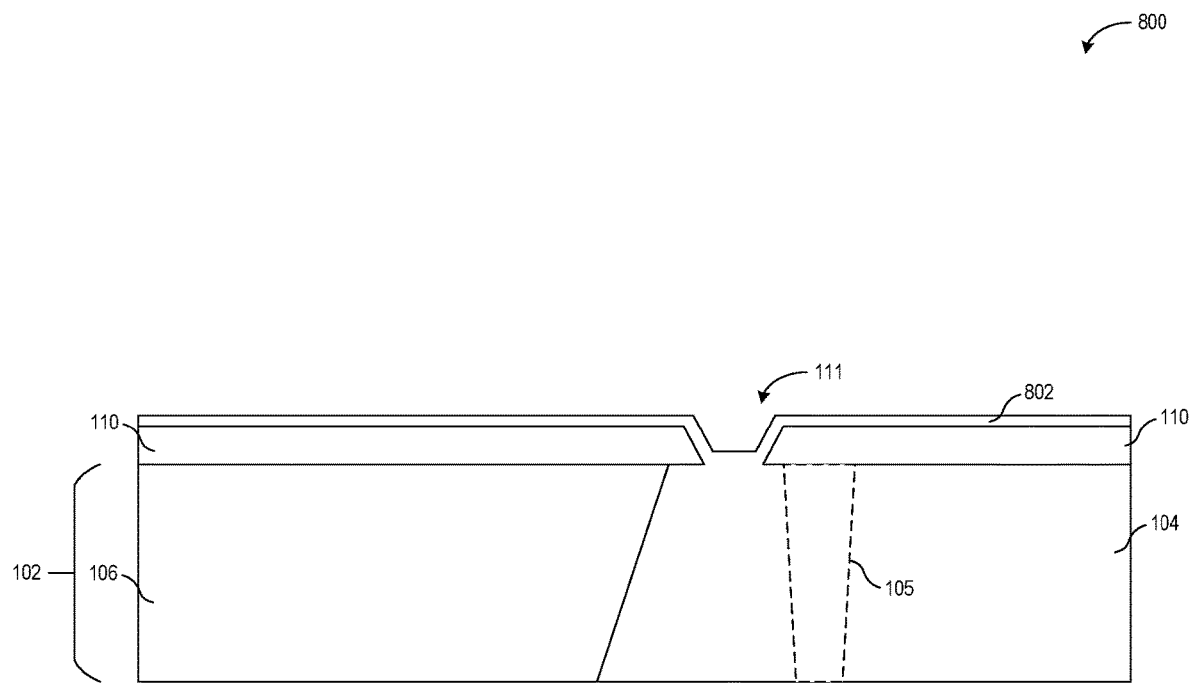

Referring next to step 212 of FIG. 2 and to FIG. 8, during a stage of fabrication 800, epitaxial regrowth of the amorphized semiconductor layer 702 is performed to form a monocrystalline semiconductor layer 802 (e.g., corresponding to, at a later stage of fabrication, the extrinsic base region 114). The monocrystalline semiconductor layer 802 may act as a seed layer that promotes subsequent epitaxial growth of monocrystalline semiconductor material. For example, a solid phase epitaxial regrowth (SPER) process may be performed to cause the amorphized semiconductor layer 702 to have a monocrystalline structure, thereby forming the monocrystalline semiconductor layer 802. In one or more embodiments, the SPER process includes heating the wafer that includes the amorphized semiconductor layer 702 at around 700° C. for around one minute (e.g., given a thickness of the amorphized semiconductor layer 702 of around 0.5 micrometers). In one or more other embodiments, the SPER process includes heating the wafer at around 600° C. for around 15 minutes (e.g., given a thickness of the amorphized semiconductor layer 702 of around 0.5 micrometers).

In one or more other embodiments, a laser annealing process may be used at step 212 instead of the SPER process. In the laser annealing process, one or more lasers may be used to heat a thin layer of the amorphized semiconductor layer 702 near the surface for a short time, melting the amorphized semiconductor layer 702 and resulting in minimal disruption to other devices that may be on the wafer on which the transistor device 101 is being formed. As the amorphized semiconductor layer 702 cools, it undergoes rapid recrystallization, thereby forming the monocrystalline semiconductor layer 802.

Figure 9:
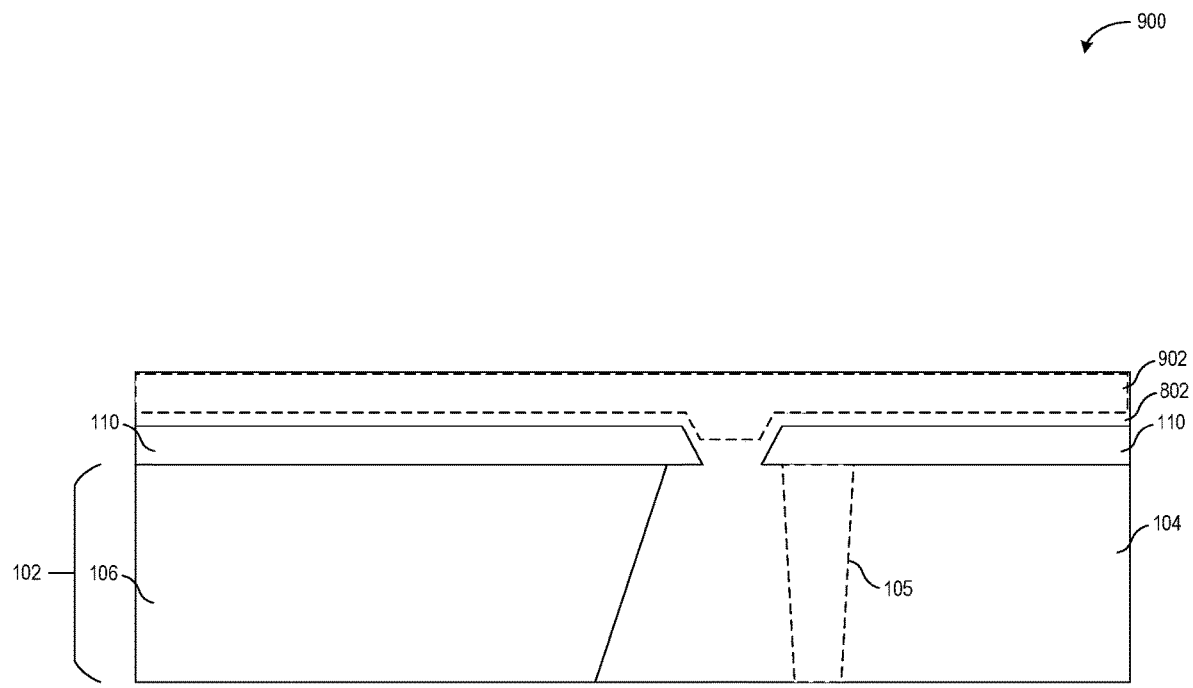

Referring next to step 214 of FIG. 2 and to FIG. 9, during a stage of fabrication 900, additional semiconductor material 902 may be grown over the monocrystalline semiconductor layer 802 (effectively growing the monocrystalline semiconductor layer 802. For example, non-selective epitaxy may be used to grow the additional semiconductor material 902 as monocrystalline semiconductor material on the monocrystalline semiconductor layer 802. In one or more embodiments, the additional semiconductor material 902 includes silicon. In one or more other embodiments, the additional semiconductor material 902 includes SiGe. In one or more embodiments, the additional semiconductor material 902 is in-situ doped with p-type material, such as C, B, O, In, or another suitable p-type dopant. In one or more other embodiments, the additional semiconductor material 902 includes a SiGe superlattice. After growth of the additional semiconductor material 902, the monocrystalline semiconductor layer 802 may substantially or completely fill the opening 111.

Figure 10:
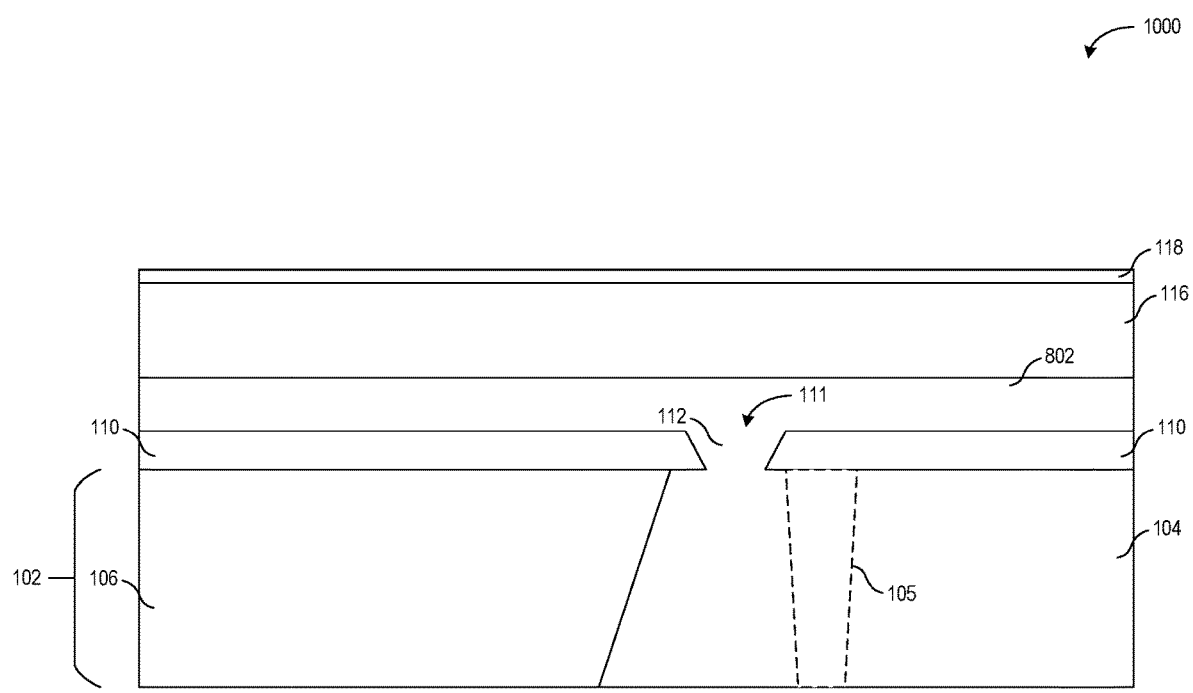

Referring next to step 216 of FIG. 2 and to FIG. 10, during a stage of fabrication 1000, additional dielectric layers (i.e., "second dielectric layers") may be formed over the monocrystalline semiconductor layer 802. For example, an oxide layer 116 may be deposited on the monocrystalline semiconductor layer 802 and a nitride layer 118 may be deposited on the oxide layer 118. In one or more other embodiments, one or more other dielectric layers, such as one or more layers of $SiO_2$, TEOS, SiN, SiON, $Al_2O_3$, AlN, spin-on glass, or other suitable dielectric material(s) may be formed on or over the monocrystalline semiconductor layer 802 instead of or in addition to the oxide layer 116 and the nitride layer 118. A region 112 includes a portion of the monocrystalline semiconductor layer 802 disposed in the opening 111.

Figure 11:
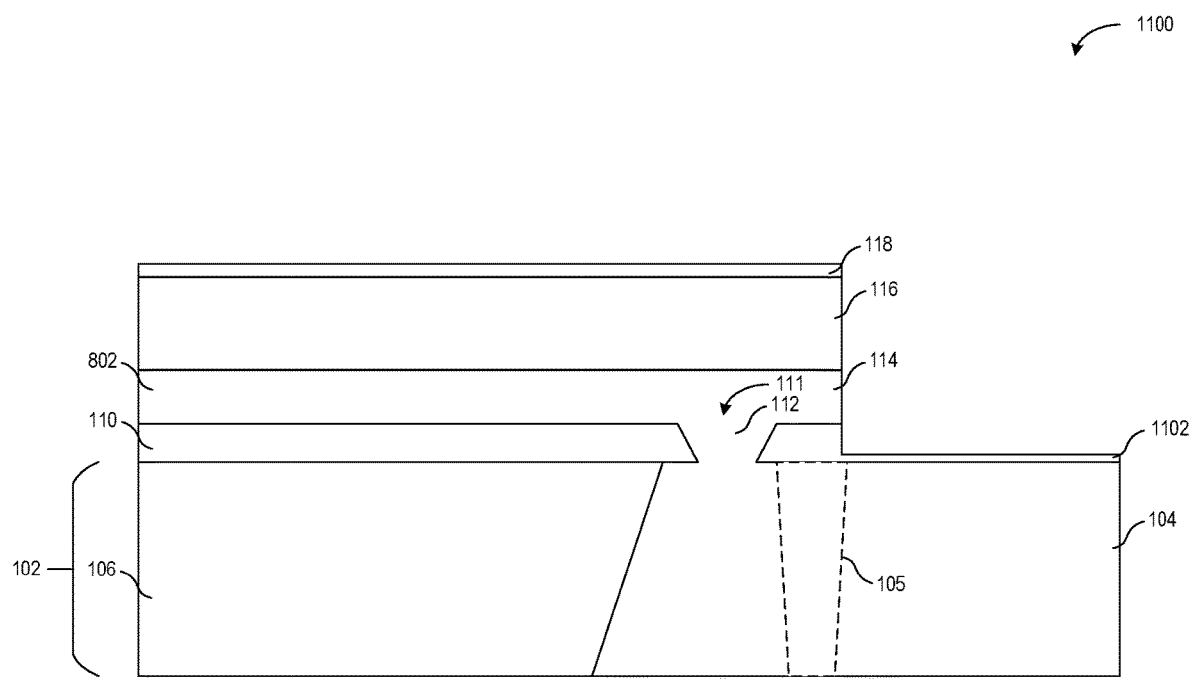

Referring next to step 218 of FIG. 2 and to FIG. 11, during a stage of fabrication 1100, portions of the nitride layer 118, the oxide layer 116, the monocrystalline semiconductor layer 802, and the dielectric layer(s) 110 may be removed via at least one selective etch process, such as a reactive ion etch (RIE) process, wet etch process, or a combination of these. In one or more embodiments, a layer of photoresist (not shown) may be applied over the nitride layer 118 and patterned to expose regions of material to be removed, then one or more etch process may be performed to remove the portions of the nitride layer 118, the oxide layer 116, the monocrystalline semiconductor layer 802, and the dielectric layer(s) 110, and then the patterned layer of photoresist may be removed (e.g., using a solvent or other suitable photoresist stripping chemical or process).

In one or more embodiments, a relatively thin layer of dielectric material 1102 (a portion of the dielectric layer(s) 110) may remain in the etched region covering the upper surface of the collector 104 following the one or more etch processes. This thin layer of dielectric material 1102 may protect the surface of the collector 104 during photoresist stripping, or Nitride/Oxide/poly/crystalline Silicon RIE, for example.

The portion of the monocrystalline semiconductor material 802 that remains following the one or more etch processes may correspond to the extrinsic base region 114. The extrinsic base region 114 is coupled to the collector region 104 via semiconductor material disposed in the region 112 (i.e., in the opening 111).

Figure 12:
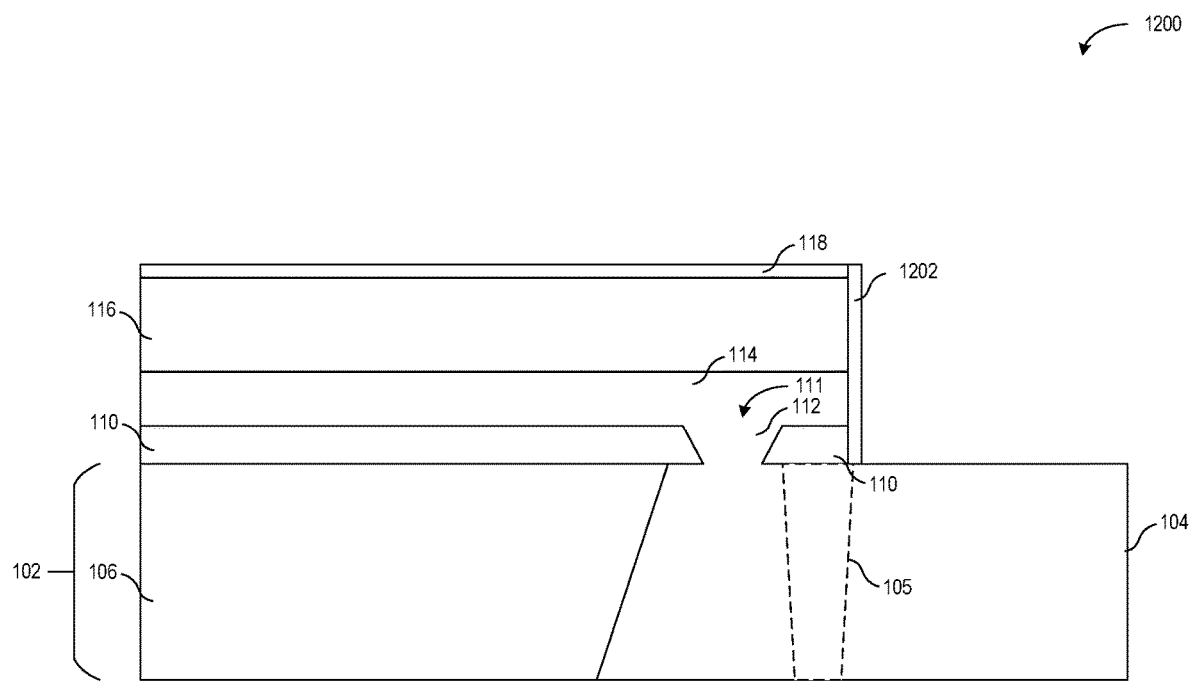

Referring next to step 220 of FIG. 2 and to FIG. 12, during a stage of fabrication 1200, a dielectric spacer 1202 may be formed covering sidewalls (i.e., side surfaces) of the dielectric layer(s) 110, the extrinsic base region 114, the oxide layer 116, and the nitride layer 118 and the layer of dielectric material 1102 may be removed to expose the surface of the collector region 104. For example, the layer of dielectric material 1102 may be removed via a selective etch process (e.g., RIE or wet etch process), then dielectric material may be deposited (e.g., via an isotropic deposition process) to form the dielectric spacer 1202. In one or more embodiments, the dielectric spacer 1202 may be formed from oxide material, such as $SiO_2$, $Al_2O_3$, or another suitable oxide material. In one or more other embodiments, the dielectric spacer 1202 is formed from another dielectric material, such as SiN, SiON, or AlN. The dielectric spacer 1202 may protect the sidewalls of the dielectric layer(s) 110, the extrinsic base region 114, the oxide layer 116, and the nitride layer 118 during subsequent epitaxial growth processes (e.g., preventing growth of semiconductor material from occurring on the sidewalls of these layers).

Figure 13:
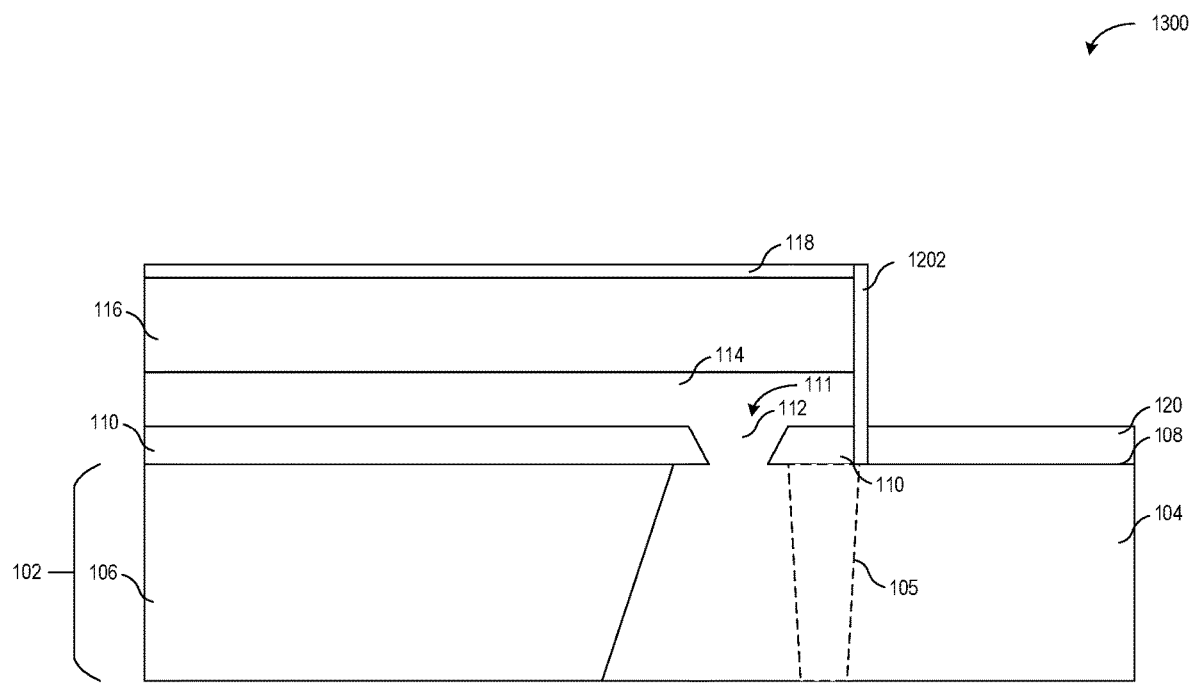

Referring next to step 222 of FIG. 2 and to FIG. 13, during a stage of fabrication 1300, the launcher layer 120 is formed on the upper surface 108 of the base substrate 102 (e.g., on an upper surface of the collector layer 104). The launcher layer 120 may be formed via selective epitaxial growth of semiconductor material. In one or more embodiments, the launcher layer 120 may be formed from silicon or another suitable semiconductor material. The launcher layer 120 may be formed from the same semiconductor material as that of the collector region 104, for example.

Figure 14:
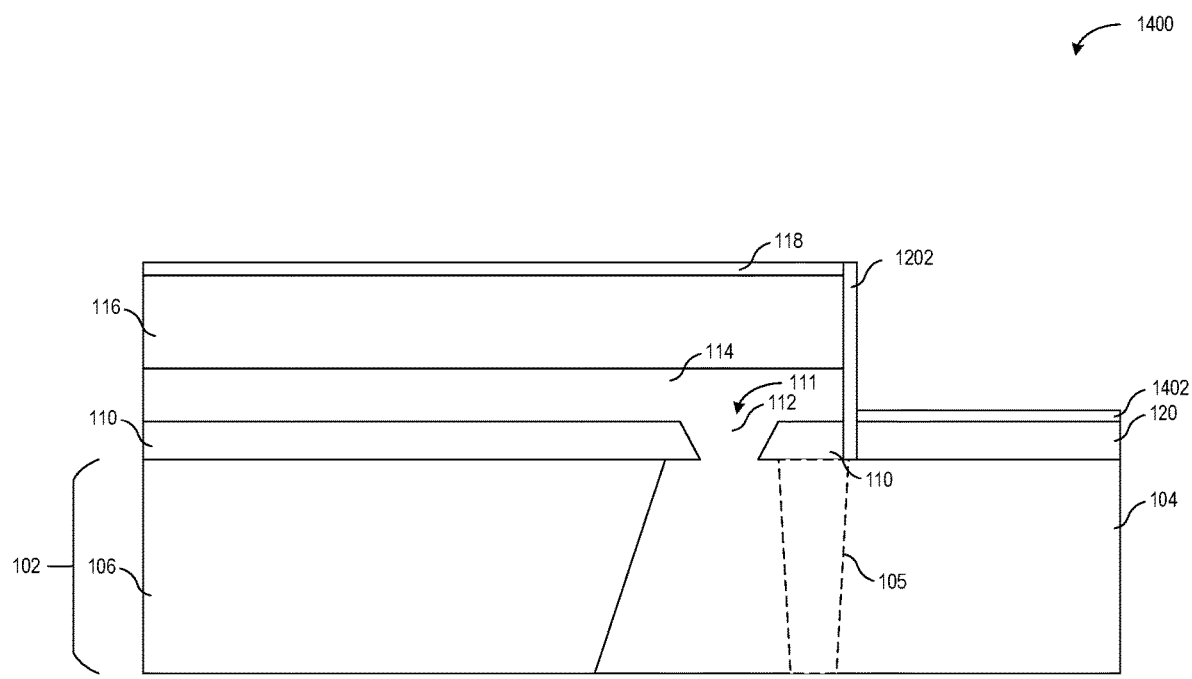

Referring next to step 224 of FIG. 2 and to FIG. 14, during a stage of fabrication 1400, semiconductor material 1402 is formed on the launcher layer to begin forming the intrinsic base region 122. The semiconductor material 1402 may be formed via selective epitaxial growth of semiconductor material on the launcher layer 120. In an embodiment, the semiconductor material 1402 may be silicon germanium. In one or more other embodiments, the semiconductor material 1402 may be Si, Ge, SiGeC, GaAs, GaN, AlN, InN, InGaP, or another suitable semiconductor material. The semiconductor material 1402 may be monocrystalline semiconductor material, for example.

Figure 15:
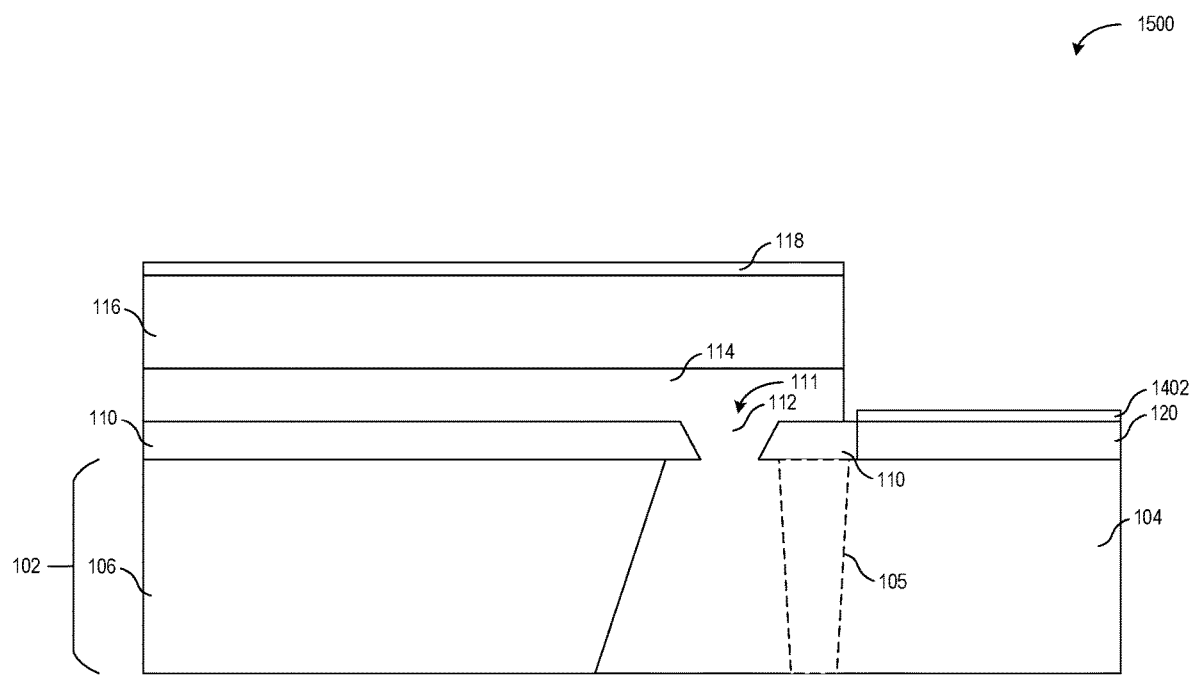

Referring next to step 226 of FIG. 2 and to FIG. 15, during a stage of fabrication 1500, the dielectric spacer 1202 may be removed. In one or more embodiments, the dielectric spacer 1202 is removed via an isotropic etch process (e.g., such as an isotropic oxide etch process for an embodiment in which the dielectric spacer 1202 includes oxide). The isotropic etch process may be a wet etch process, as a non-limiting example.

Figure 16:
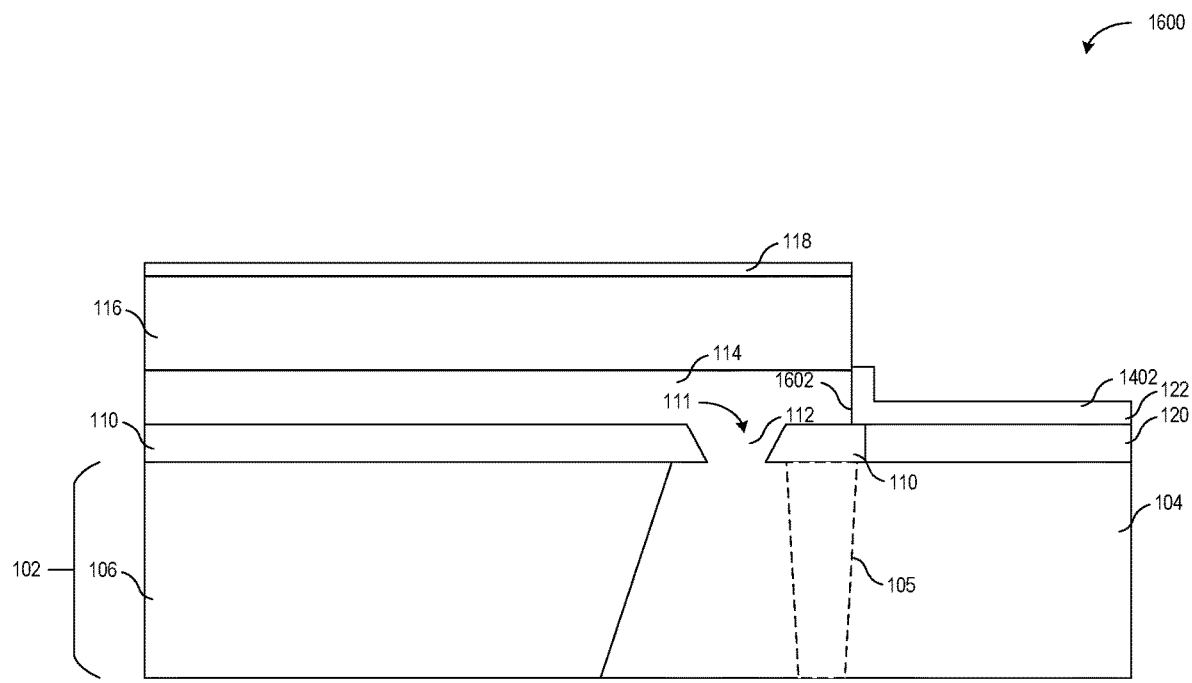

Referring next to step 228 of FIG. 2 and to FIG. 16, during a stage of fabrication 1600, after removal of the dielectric spacer 1202, further epitaxial growth of the semiconductor material 1402 may be performed to form the intrinsic base region 122. In one or more embodiments, a selective epitaxial growth process may be performed during the stage of fabrication 1600 such that additional semiconductor material (e.g., SiGe or another suitable semiconductor material) is grown on both the previously formed semiconductor material 1402 and on a sidewall 1602 (sometimes referred to as "side surface 1602") of the extrinsic base region 114. Such additional semiconductor material may be monocrystalline semiconductor material, for example.

Figure 17:
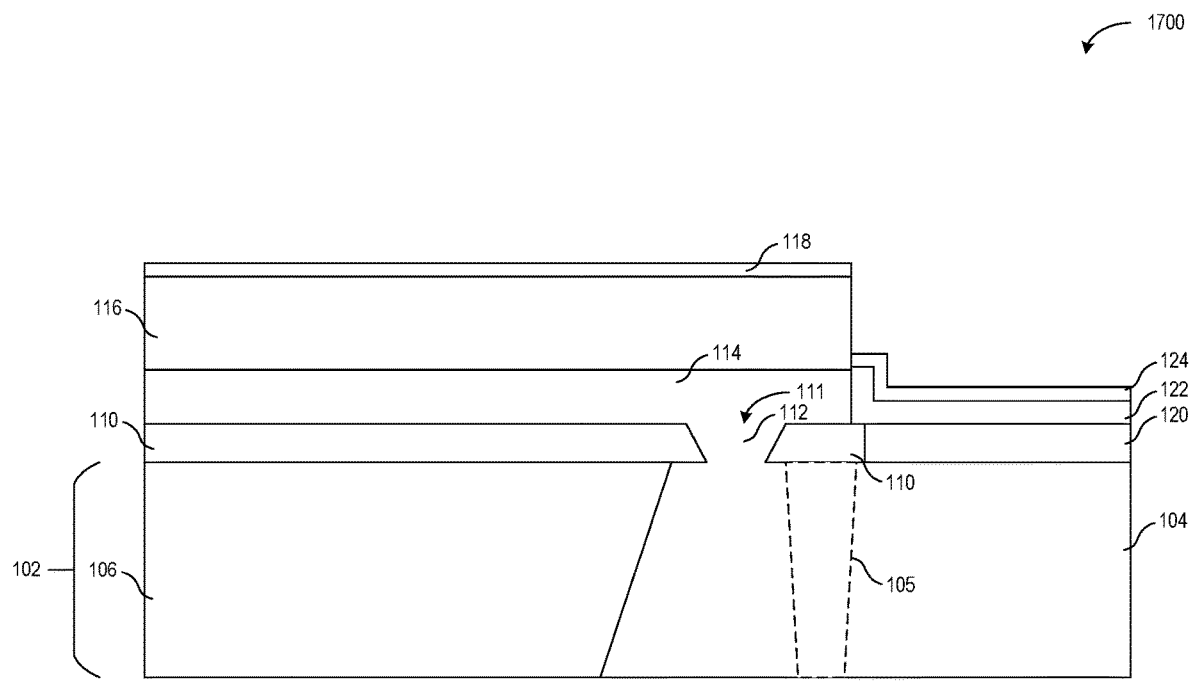

Referring next to step 230 of FIG. 2 and to FIG. 17, during a stage of fabrication 1700, an emitter cap layer 124 may be formed on the intrinsic base region 122. In one or more embodiments, the emitter cap layer 124 may be formed via selective epitaxial growth of semiconductor material. In one or more embodiments, the emitter cap layer 124 may be formed from silicon germanium. In one or more other embodiments, the emitter cap layer 124 may be formed from Si, Ge, SiGeC, GaAs, GaN, AlN, InN, InGaP, or another suitable semiconductor material.

Referring next to step 232 of FIG. 2, the wafer on which the transistor device 101 is being formed may be annealed. For example, during this first annealing process, the wafer may be heated to 900~1100° C.

Figure 18:
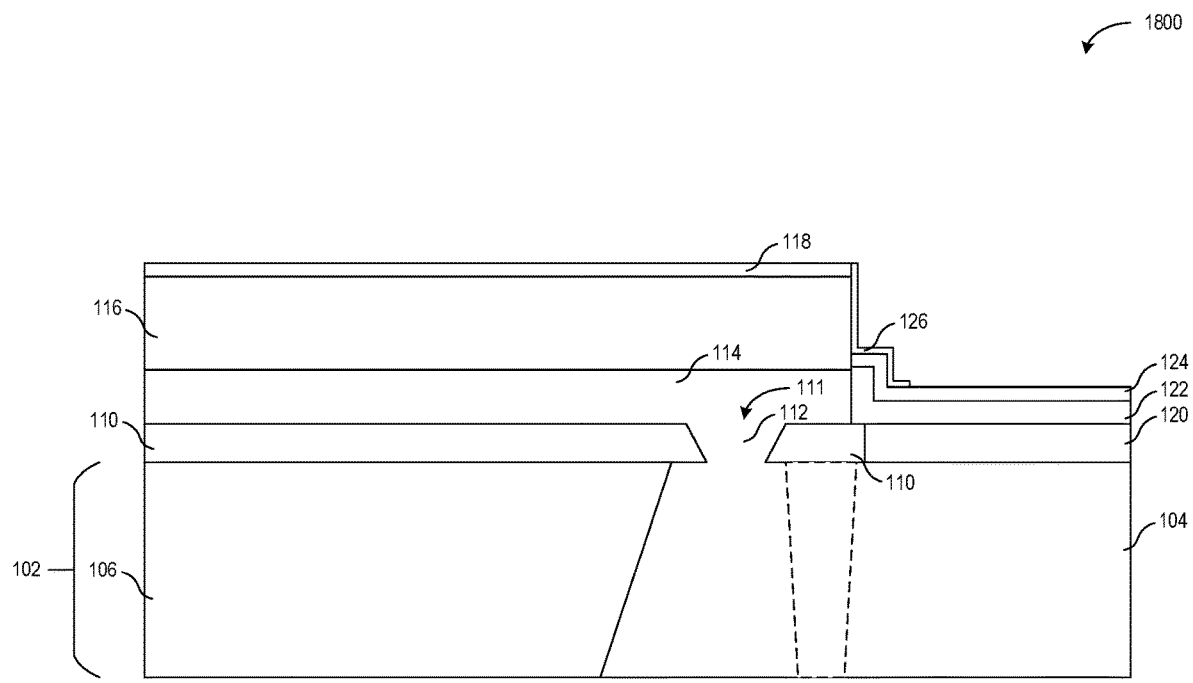

Referring next to step 234 of FIG. 2 and to FIG. 18, during a stage of fabrication 1800, the inside spacer 126 may be formed over a portion of the emitter cap layer 124. In one or more embodiments, the inside spacer 126 may be formed on one or more surfaces of a first portion of the emitter cap layer 124, and not on surfaces of a second portion of the emitter cap layer 124. The inside spacer 126 may be at least partially formed on respective sidewalls (i.e., side surfaces) of the oxide layer 116 and the nitride layer 118.

In one or more embodiments, the inside spacer 126 is formed via isotropic deposition of one or more dielectric materials, such as $SiO_2$, TEOS, SiN, SiON, $Al_2O_3$, AlN, or other suitable dielectric materials and subsequent selective isotropic etching of the one or more dielectric materials. In an embodiment, the inside spacer 126 is formed via selective isotropic deposition of a first oxide layer, a nitride layer, and a second oxide layer, sequentially, such that the nitride layer is disposed between the first oxide layer and the second oxide layer of the inside spacer 126.

Figure 19:
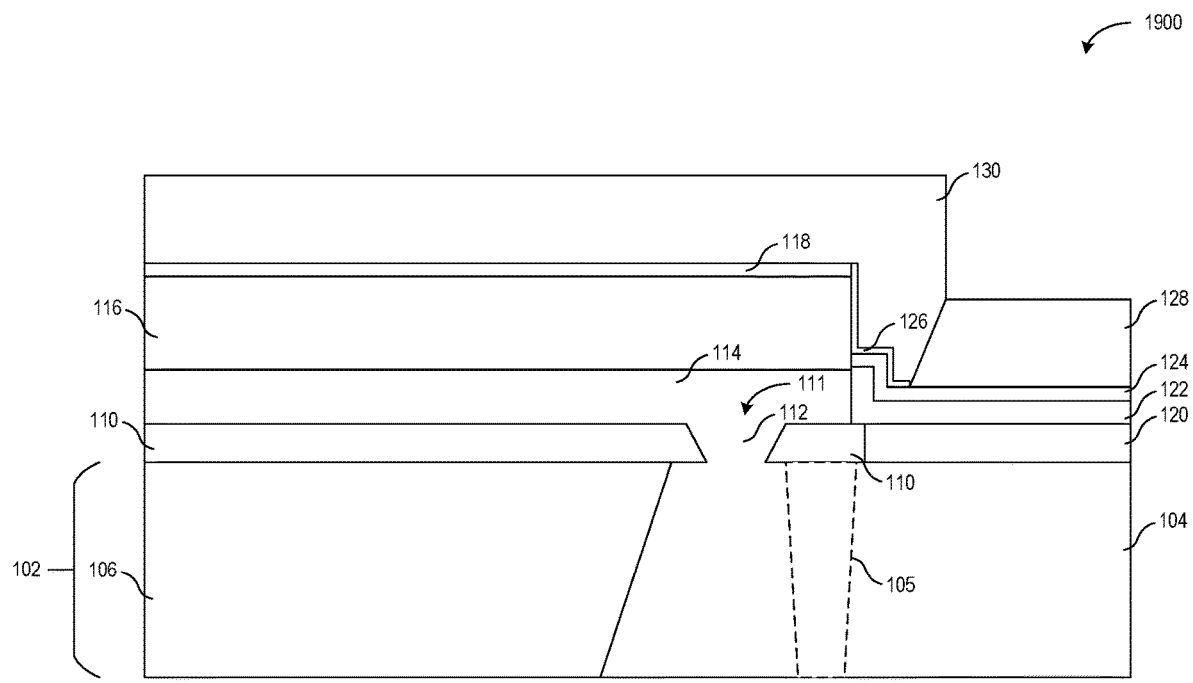

Referring next to step 236 of FIG. 2 and to FIG. 19, during a stage of fabrication 1900, a non-selective epitaxial growth process is performed to deposit semiconductor material over the emitter cap layer 124, the inside spacer 126, and the nitride layer 118. The epitaxial growth process, being non-selective, causes monocrystalline semiconductor material to grow on the e-cap layer 124 to form the intrinsic emitter region 128 and causes polycrystalline semiconductor material to grow on the nitride layer 118 and the inside spacer 126 to form the extrinsic emitter region 130. In an embodiment, the intrinsic emitter region 128 and the extrinsic emitter region 130 may each be formed from silicon. In one or more other embodiments, the intrinsic emitter region 128 and the extrinsic emitter region 130 may be formed from one or more other suitable semiconductor materials, such as Si, Ge, SiGeC, GaAs, GaN, AlN, InN, or InGaP as non-limiting examples.

Figure 20:
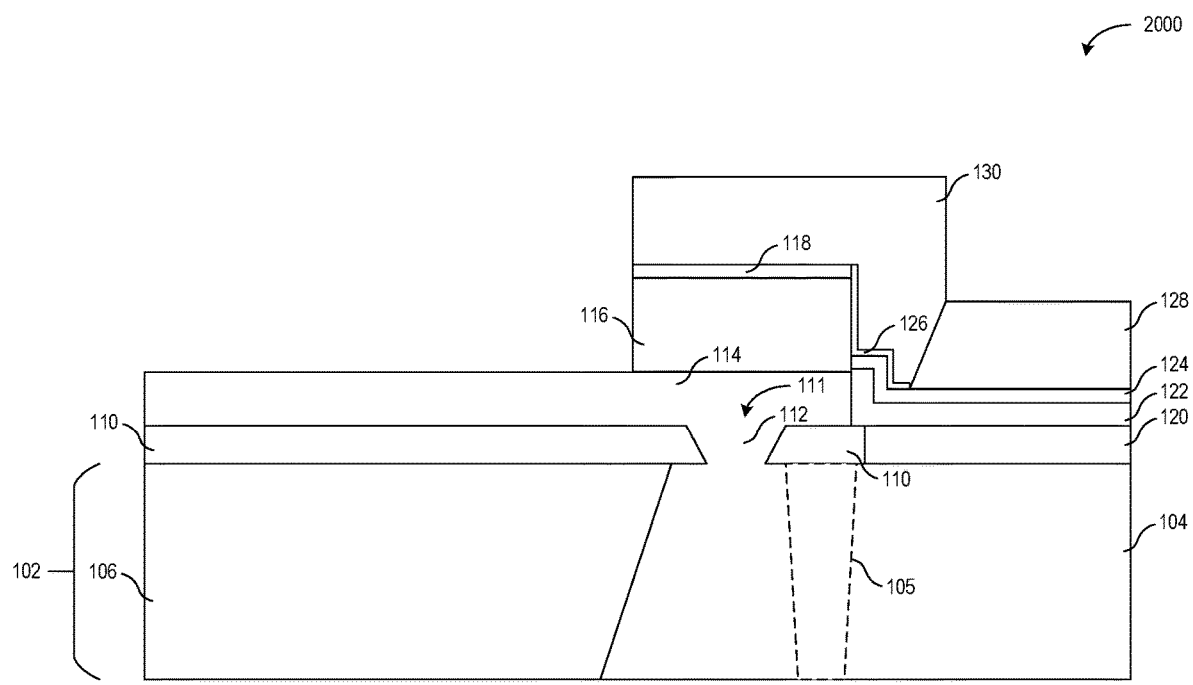

Referring next to step 238 of FIG. 2 and to FIG. 20, during a stage of fabrication 2000, portions of the polycrystalline material of the extrinsic emitter region 130, the oxide layer 116, and the nitride layer 118 are removed via one or more etch processes (e.g., respective anisotropic etch processes such as anisotropic RIE processes). The portions of these layers that are removed at the stage of fabrication 2000 may be disposed (prior to their removal) over the extrinsic base region 114.

Referring next to step 240 of FIG. 2 (ANNEAL) the wafer on which the transistor device 101 is being formed may be annealed again. For example, during this second annealing process, the wafer may be heated to 900~1100° C.

Figure 21:
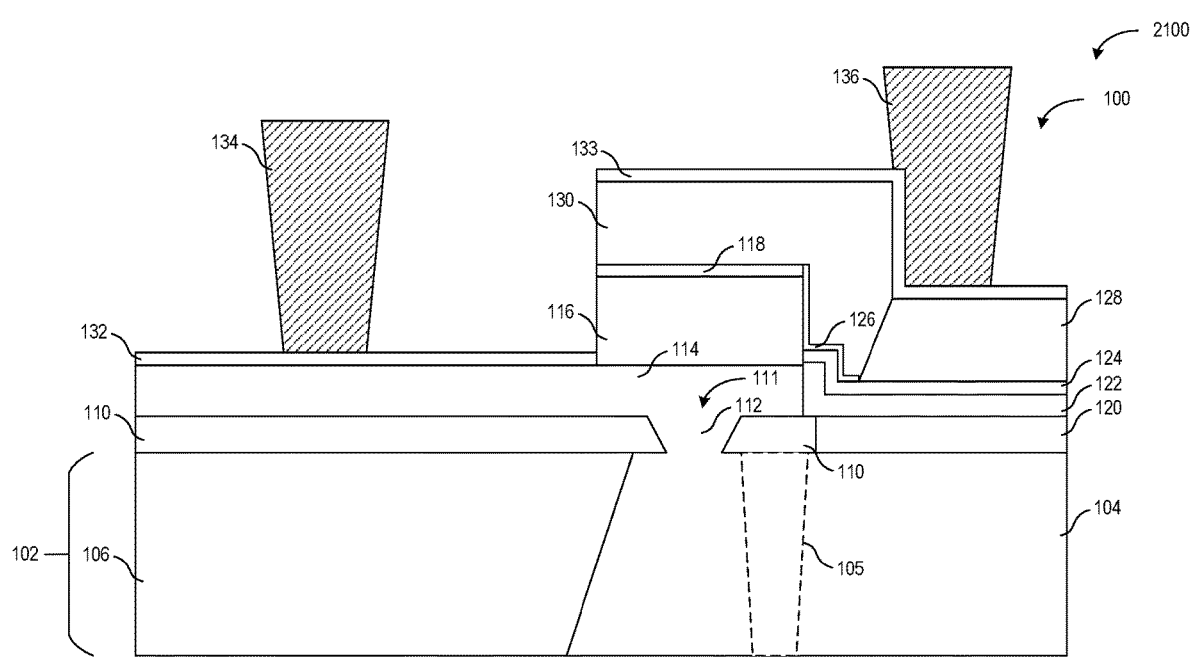

Referring next to step 242 of FIG. 2 and to FIG. 21, during a stage of fabrication 2100, the contact layers 132 and 133, the base electrode 134, and the emitter electrode 136 are formed. The contact layer 132 may be formed on the extrinsic base region 114. The contact layer 133 may be formed over the extrinsic emitter region 130 and the intrinsic emitter region 128. The base electrode 134 may be formed over the extrinsic base region 114 and may be formed directly on the contact layer 132. The emitter electrode 136 may be formed over the intrinsic emitter region 128 and may be formed directly on the contact layer 133. In an embodiment, the contact layers 132 and 133 are formed via a silicidation process. In one or more embodiments, the contact layers 132 and 133 include one or more of TiW, TiWN, WSi, CoSi, PtSi, NiPtSi, or one or more other suitable material(s). In one or more embodiments, the base electrode 134 and the emitter electrode 136 may include one or more of copper, aluminum, tungsten, or another suitable conductive material.

Figure 22:
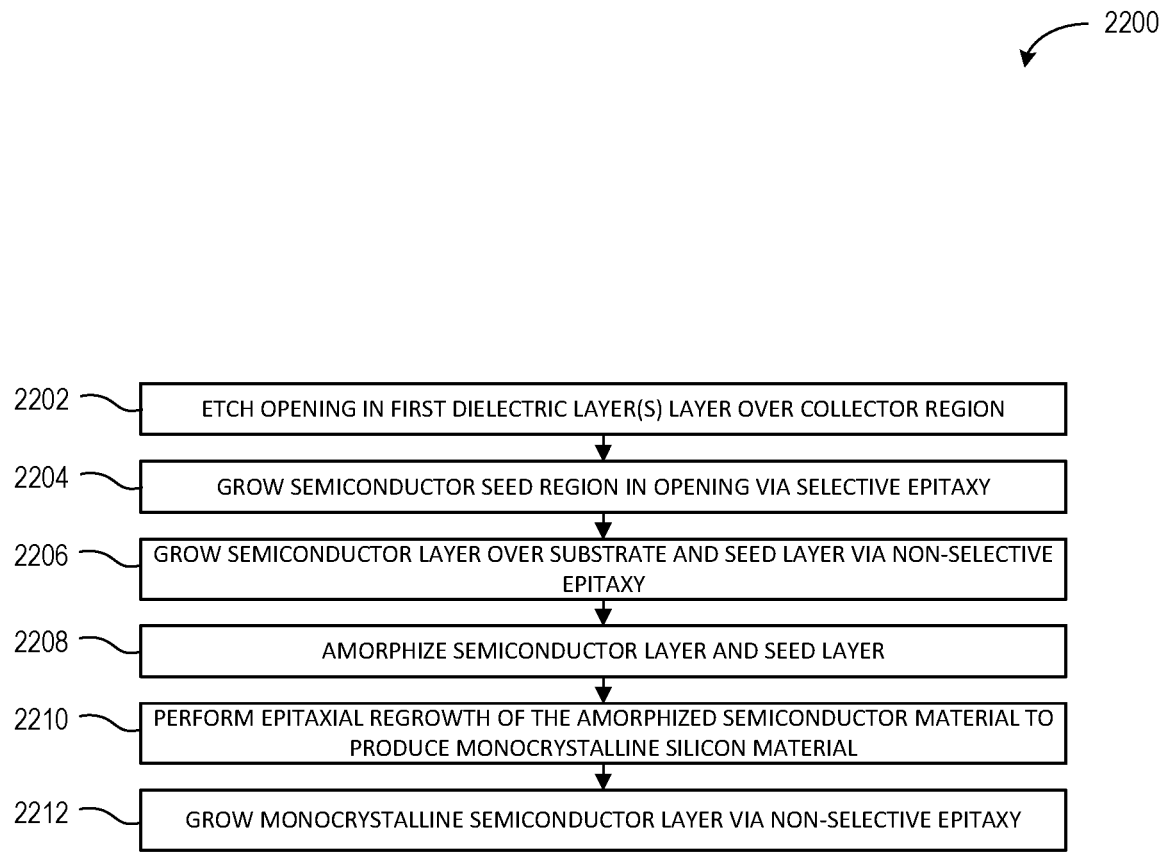
FIG. 22 is a process flow diagram describing a method for fabricating a transistor device including using a seed layer in connection with the formation with an intrinsic base layer, in accordance with various embodiments.

FIG. 22 is a process flow diagram depicting a method 2200 for fabricating at least a portion of a transistor device (e.g., the transistor device 2900 of FIG. 29), in accordance with various embodiments. For example, the steps 2202-2212 of the method 2200 may be performed in place of steps 206 through 214 of the method 200 of FIG. 2 when fabricating such a transistor device. For enhanced understanding, FIG. 22 may be viewed simultaneously with FIGS. 23-28, which are cross sectional views depicting a transistor device (e.g., the transistor device 2900 of FIG. 29) at various stages of fabrication in accordance with various embodiments. Various elements described in connection with FIGS. 22-29 may be similar to corresponding elements of the transistor 101 of FIG. 1, and like reference numerals may be used to refer to like elements.

Figure 23:
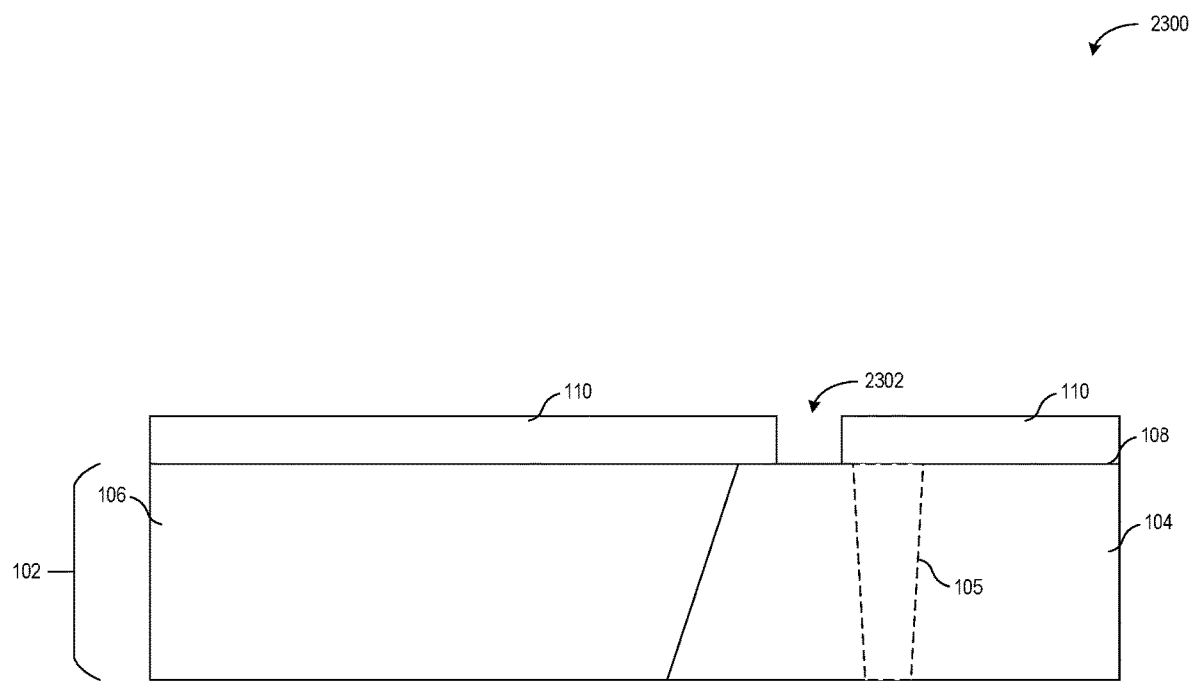

Referring first to step 2202 and to FIG. 23, at a stage of fabrication 2300, an opening 2302 may be formed in the one or more dielectric layers 110, such that a portion of the upper surface 108 of the base substrate 102 (corresponding to an upper surface of the collector region 104) is exposed. The opening 2302 may be formed using one or more etch processes, which may include one or more wet chemical etches, reactive ion etches, or other suitable etch processes. In an embodiment, the opening 2302 is formed using an anisotropic etch process. In one or more embodiments, sidewalls of the one or more dielectric layers 110 that define the opening 2302 may be substantially vertical (i.e., within 5% to 10% of extending normal from the upper surface 108 of the base substrate 102). For embodiments in which the one or more dielectric layers 110 include multiple dielectric layers formed from different respective dielectric materials with respectively different etch rates, multiple etch processes may be used to form the opening 2302. For embodiments in which the one or more dielectric layers 110 include a single dielectric layer (e.g., oxide layer), a single etch process (e.g., an anisotropic or isotropic reactive ion etch process) may be used. In one or more embodiments, surfaces of the one or more dielectric layers 110 that are not being etched at the stage of fabrication 500 may be protected using patterned photoresist material, which may be removed upon completion of the etch process(es).

Figure 24:
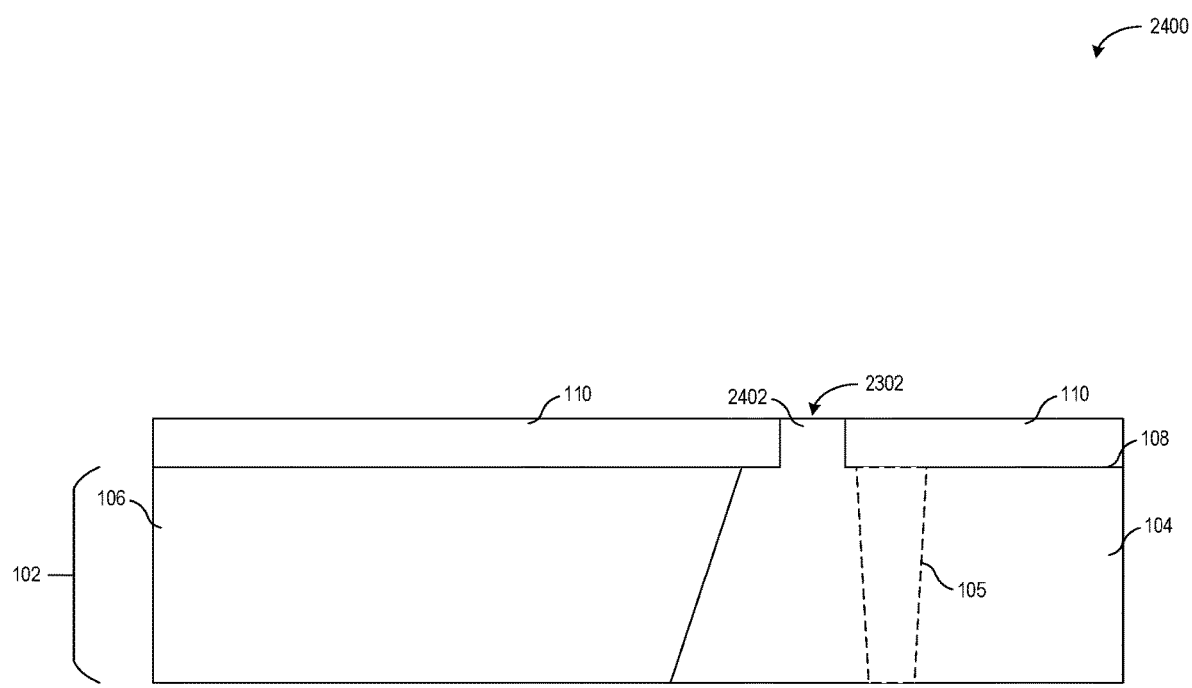

Referring to step 2204 and to FIG. 24, during a stage of fabrication 2400, selective epitaxy is performed to grow semiconductor material (e.g., silicon as a non-limiting example) in the opening 2302 to form a seed region 2402. The seed region 2402 may include monocrystalline semiconductor material. The monocrystalline semiconductor material of the seed region 2402 may be the same as that of the collector region 104, in one or more embodiments.

Figure 25:
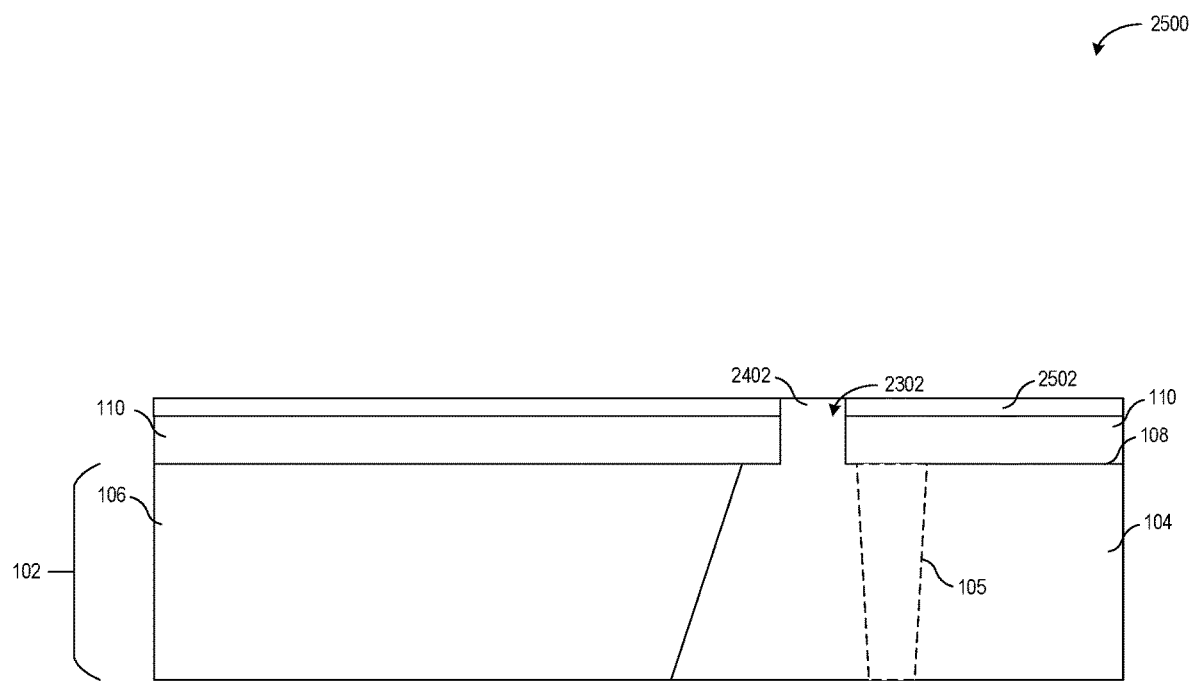

Referring to step 2206 and to FIG. 25, during a stage of fabrication 2500, non-selective epitaxy is performed to grow semiconductor material (e.g., silicon as a non-limiting example) over the seed region 2402 and the one or more dielectric layers 110. The non-selective epitaxy process may extend the monocrystalline semiconductor material of the seed region 2402 and simultaneously form a polycrystalline semiconductor layer 2502 over the one or more dielectric layers 110.

Figure 26:
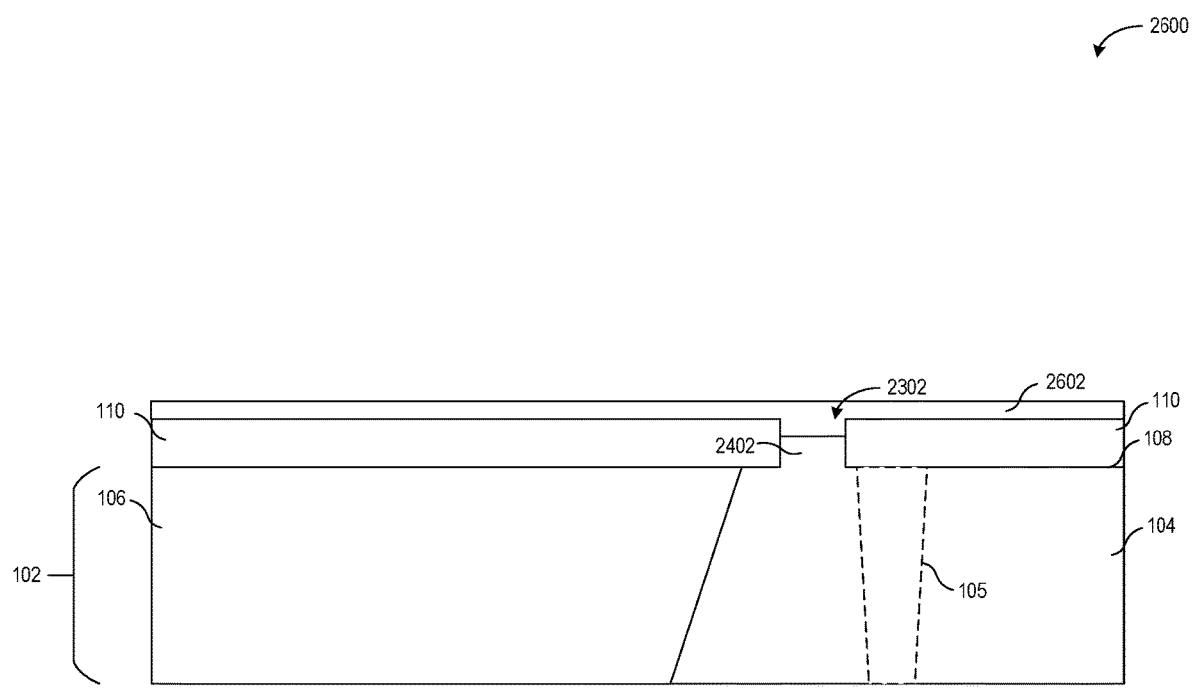

Referring to step 2208 and to FIG. 26, during a stage of fabrication 2600, the polycrystalline semiconductor layer 2502 and a portion of the semiconductor material in the seed region 2402 may be amorphized to produce an amorphous semiconductor layer 2602. In one or more embodiments, the amorphized semiconductor layer 2602 may be formed via ion implantation of germanium (or, in one or more other embodiments, Xe, Ar, or Sn) in the polycrystalline semiconductor layer 2502 and the portion of the semiconductor material in the seed region 2402, which may change the polycrystalline semiconductor layer 2502 and the (monocrystalline) portion of the semiconductor material in the seed region 2402 to have respective amorphous structures.

Figure 27:
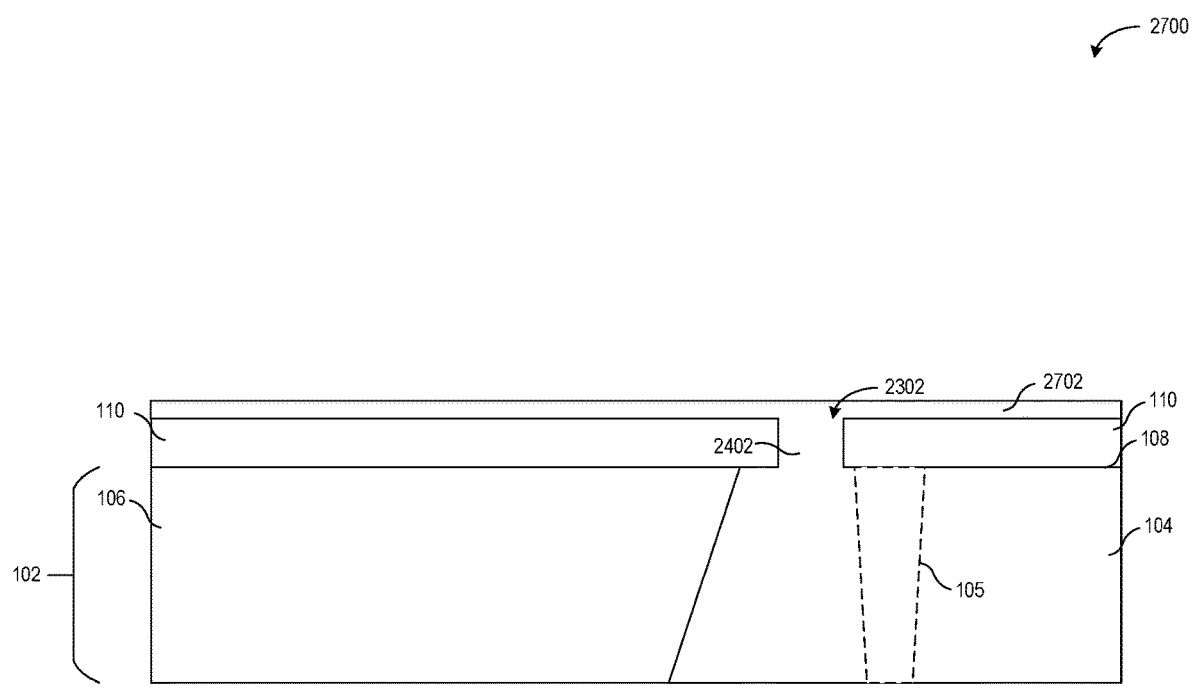

Referring to step 2210 and to FIG. 27, during a stage of fabrication 2700, epitaxial regrowth of the amorphized semiconductor layer 2602 is performed to form a monocrystalline semiconductor layer 2702 (e.g., corresponding to, at a later stage of fabrication, the extrinsic base region 114). The monocrystalline semiconductor layer 2702 may act as a seed layer that promotes subsequent epitaxial growth of monocrystalline semiconductor material. For example, a solid phase epitaxial regrowth (SPER) process may be performed to cause the amorphized semiconductor layer 2602 to have a monocrystalline structure, thereby forming the monocrystalline semiconductor layer 2702. In one or more embodiments, the SPER process includes heating the wafer that includes the amorphized semiconductor layer 2602 at around 700° C. for around one minute (e.g., resulting in monocrystalline semiconductor layer 2702 of around 0.5 micrometers away from seed region). In one or more other embodiments, the SPER process includes heating the wafer at around 600° C. for around 15 minutes (e.g., resulting in monocrystalline semiconductor layer 2702 of around 0.5 micrometers away from seed region).

Figure 28:
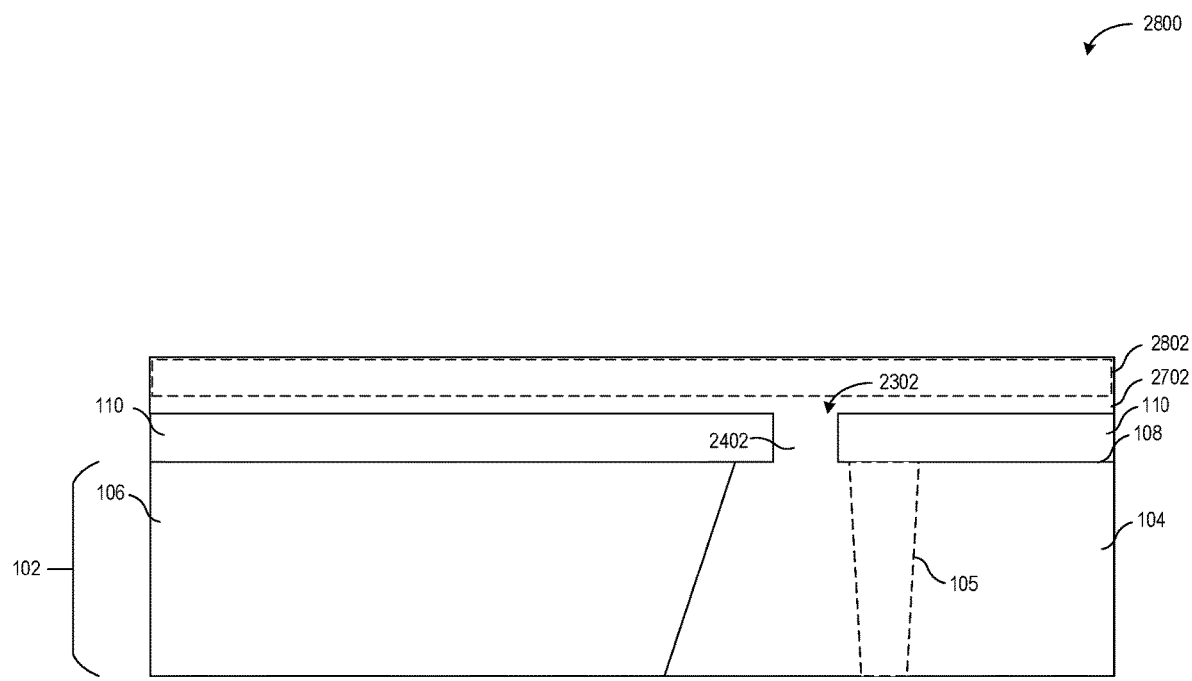

Referring to step 2212 and to FIG. 28, during a stage of fabrication 2800, additional semiconductor material 2802 may be grown over the monocrystalline semiconductor layer 2702 (effectively increasing the thickness of the monocrystalline semiconductor layer 2702 through the addition of the additional semiconductor material 2802). For example, non-selective epitaxy may be used to grow the additional semiconductor material 2802 as monocrystalline semiconductor material on the monocrystalline semiconductor layer 2702. In one or more embodiments, the additional semiconductor material 2802 includes silicon. In one or more other embodiments, the additional semiconductor material 2802 includes SiGe. In one or more embodiments, the additional semiconductor material 2802 is in-situ doped with p-type material, such as C, B, O, In, or another suitable p-type dopant. In one or more other embodiments, the additional semiconductor material 2802 includes a SiGe superlattice.

Figure 29:
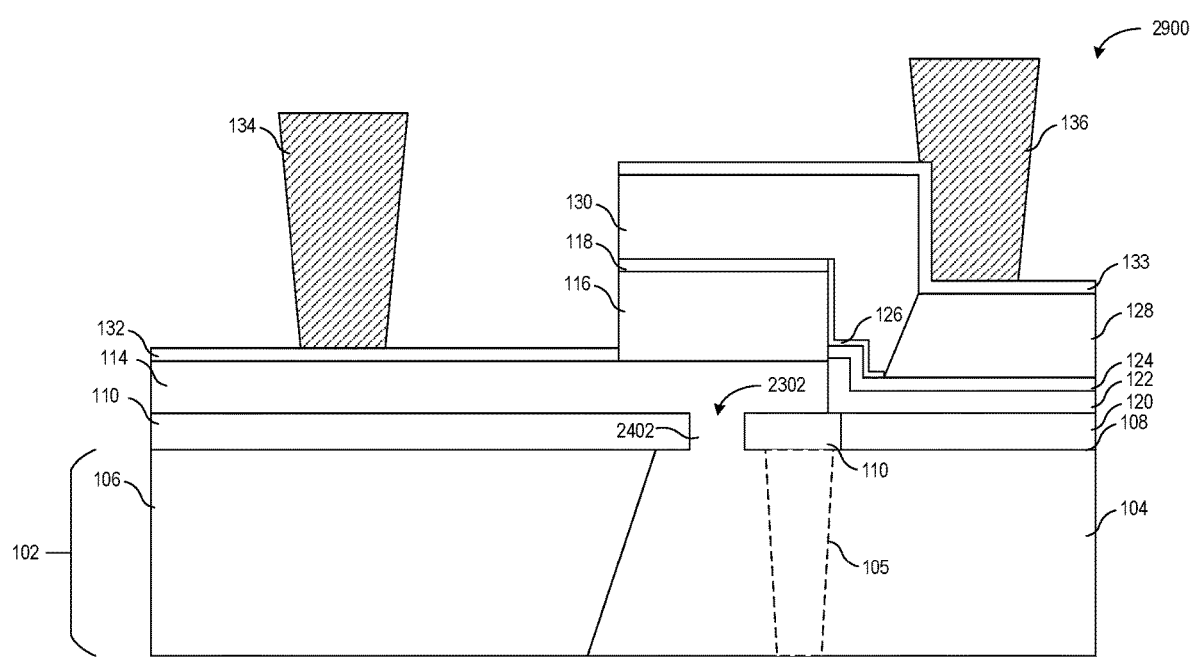
FIG. 29 is a cross sectional side view of a transistor device fabricated using the method of FIG. 22 and the stages of fabrication of FIGS. 23-28, in accordance with various embodiments.

FIG. 29 shows a cross-sectional side view of a transistor device 2900, according to an embodiment. In some embodiments, the transistor device 2900 may be fabricated, at least in part, using the method 2200 of FIG. 22 and/or the steps of fabrication 2300, 2400, 2500, 2600, 2700, 2800 of FIGS. 23-28. As shown, the seed region 2402 connecting the collector region 104 and the extrinsic base region 114 may include semiconductor material (e.g., monocrystalline semiconductor material) formed in the opening 2302, which may have substantially vertical sidewalls (e.g., sidewalls that extend within around 5% to 10% of normal to the upper surface 108 of the base substrate 102). One or more other aspects or elements of the transistor device 2900 may be similar to those of the transistor device 101 of FIG. 1 and their descriptions are not repeated here for brevity.

Figure 30:
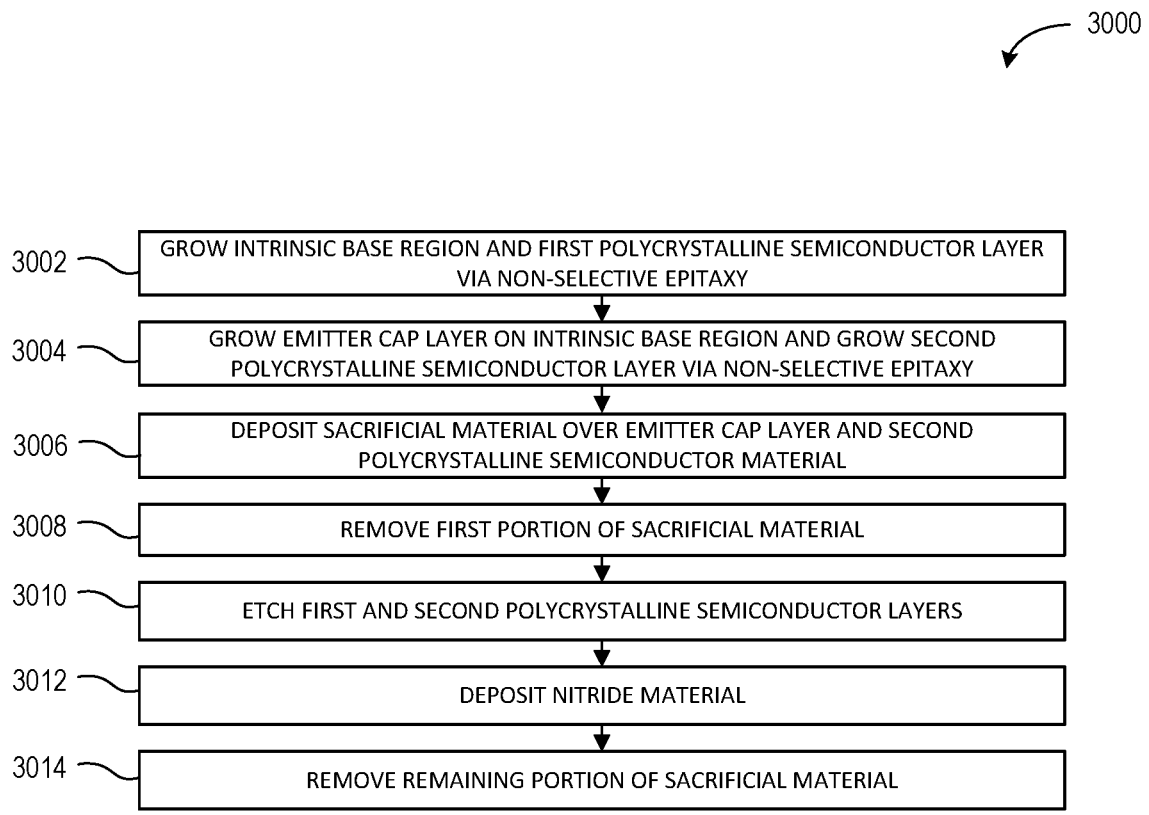
FIG. 30 a process flow diagram describing a method for fabricating an extrinsic base layer of a transistor device using non-selective epitaxial growth to form an intrinsic base layer, in accordance with various embodiments.
Figure 31:
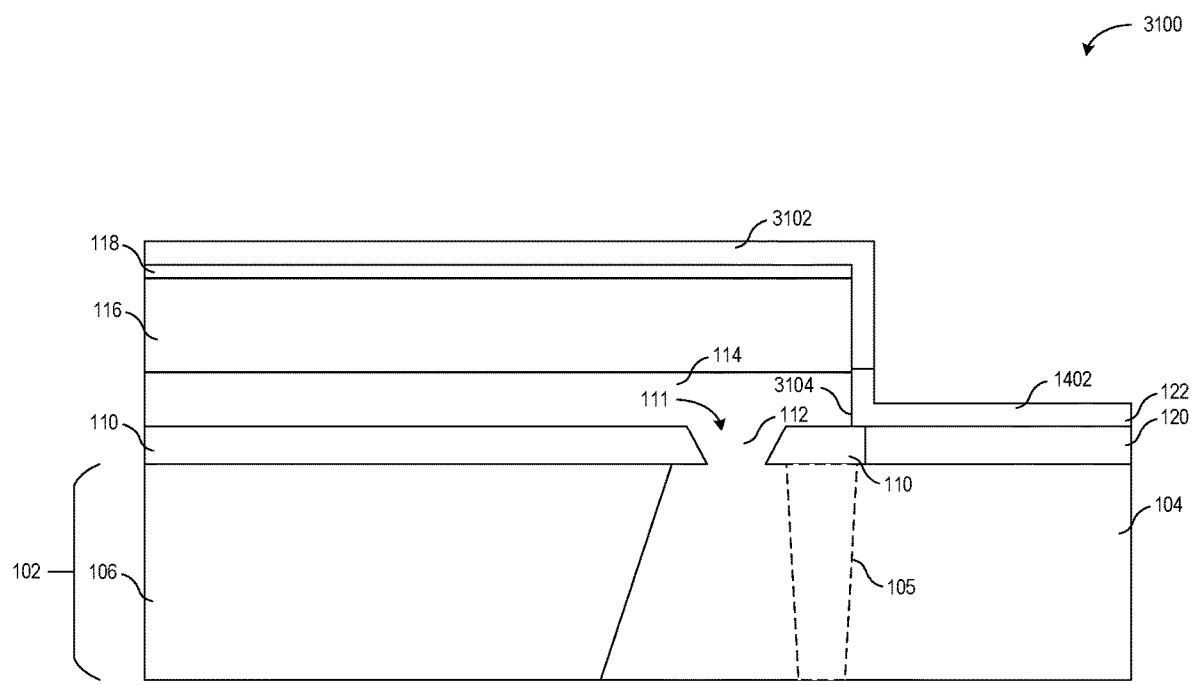
FIGS. 31-37 are cross sectional views depicting a transistor device at various stages of fabrication corresponding to, for example, the method of FIG. 30, in accordance with various embodiments.

FIG. 30 is a process flow diagram depicting a method 3000 for fabricating at least a portion of a transistor device (e.g., the transistor device 3800 of FIG. 38), in accordance with various embodiments. For example, the steps 3002-3014 of the method 3000 may be performed in place of steps 228 and 230 of the method 200 of FIG. 2 when fabricating such a transistor device. For enhanced understanding, FIG. 30 may be viewed simultaneously with FIGS. 31-37, which are cross sectional views depicting a transistor device (e.g., the transistor device 3800 of FIG. 30) at various stages of fabrication in accordance with various embodiments. Various elements described in connection with FIGS. 31-38 may be similar to corresponding elements of the transistor 101 of FIG. 1, and like reference numerals may be used to refer to like elements.

Referring first to step 3002 and to FIG. 30, at a stage of fabrication 3100, after removal of the dielectric spacer 1202 (e.g., at stage of fabrication 1500 of FIG. 15 associated with the step 226 of FIG. 2), a non-selective epitaxial growth process may be performed to form the intrinsic base region 122. For example, the non-selective epitaxial growth process may, substantially simultaneously, further grow the monocrystalline semiconductor material 1402, grow monocrystalline semiconductor material on a sidewall 3104 (sometimes referred to as "side surface 3104") of the extrinsic base region 114, and grow a first polycrystalline semiconductor layer 3102 on an upper surface of the nitride layer 118 and sidewalls of the nitride layer 118 and the oxide layer 116. In some embodiments, the non-selective epitaxial growth process may include epitaxial growth of SiGe or another suitable semiconductor material. In some embodiments, the semiconductor material grown via the non-selective epitaxial growth process of the stage of fabrication 3100 is the same type of semiconductor material as the semiconductor material 1402 (though not necessarily with respect to crystalline structure), such as (but not limited to) Si, Ge, SiGe, SiGeC, GaAs, GaN, AlN, InN, InGaP, or another suitable semiconductor material.

Figure 32:
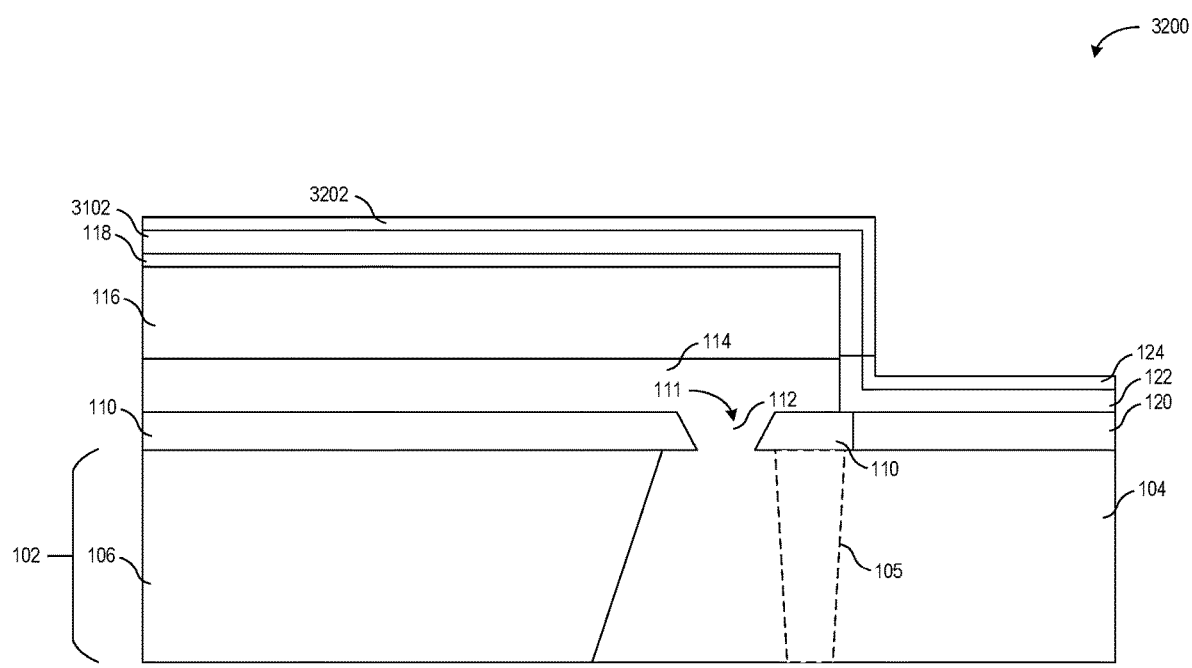

Referring to step 3004 and to FIG. 32, at a stage of fabrication 3200, a non-selective epitaxial growth process may be performed to form an emitter cap layer 124 (e.g., a layer of monocrystalline semiconductor material) on the intrinsic base region 122 and a second polycrystalline semiconductor layer 3202 on the first polycrystalline semiconductor material 3102. In one or more embodiments, the emitter cap layer 124 and the second polycrystalline semiconductor layer 3202 may be formed from silicon germanium. In one or more other embodiments, the emitter cap layer 124 and the second polycrystalline semiconductor layer 3202 may be formed from Si, Ge, SiGeC, GaAs, GaN, AlN, InN, InGaP, or another suitable semiconductor material.

Figure 33:
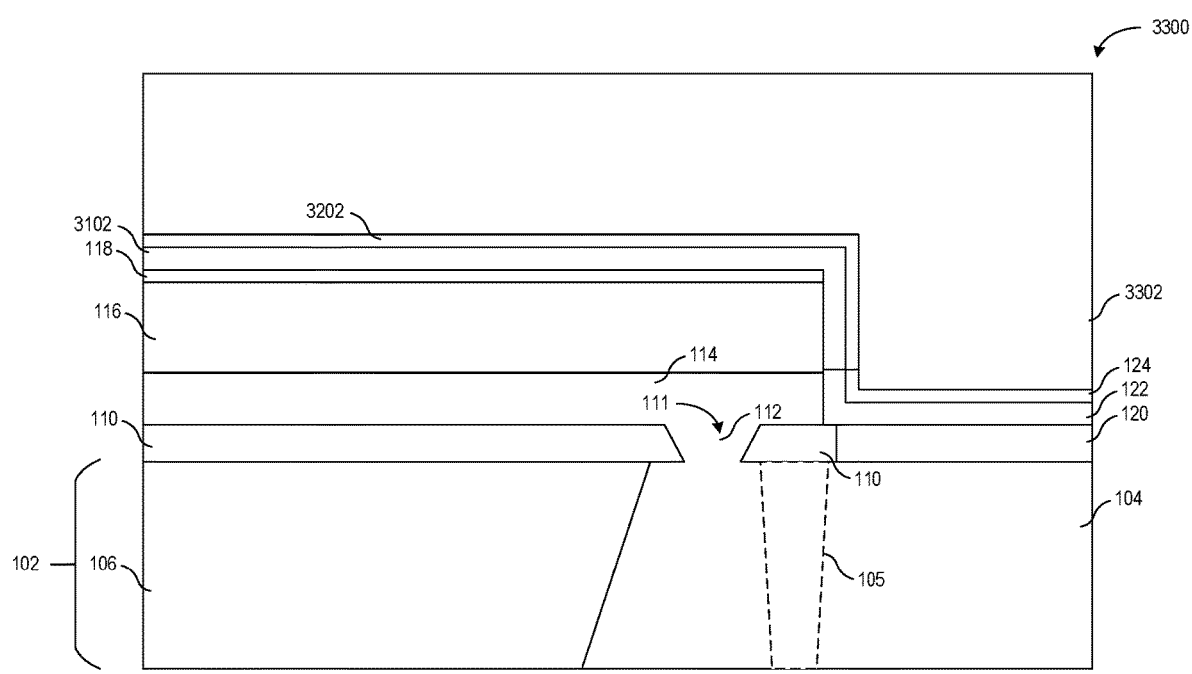

Referring to step 3006 and to FIG. 33, at a stage of fabrication 3300, sacrificial material 3302 may be deposited over the emitter cap layer 124 and the second polycrystalline semiconductor layer 3202. In one or more embodiments, the sacrificial material 3302 may be dielectric material, such as such as $SiO_2$, TEOS, SiN, SiON, $Al_2O_3$, AlN, or other suitable dielectric material. In one or more other embodiments, the sacrificial material 3302 may be photoresist material, such as epoxy-based polymer photoresist material, off-stoichiometry thiol-enes (OSTE) polymer based photoresist material, hydrogen silsesquioxane (HSQ) based photoresist material, diazonaphthoquinone (DNQ)-Novolac based photoresist material, or another suitable type of photoresist material.

Figure 34:
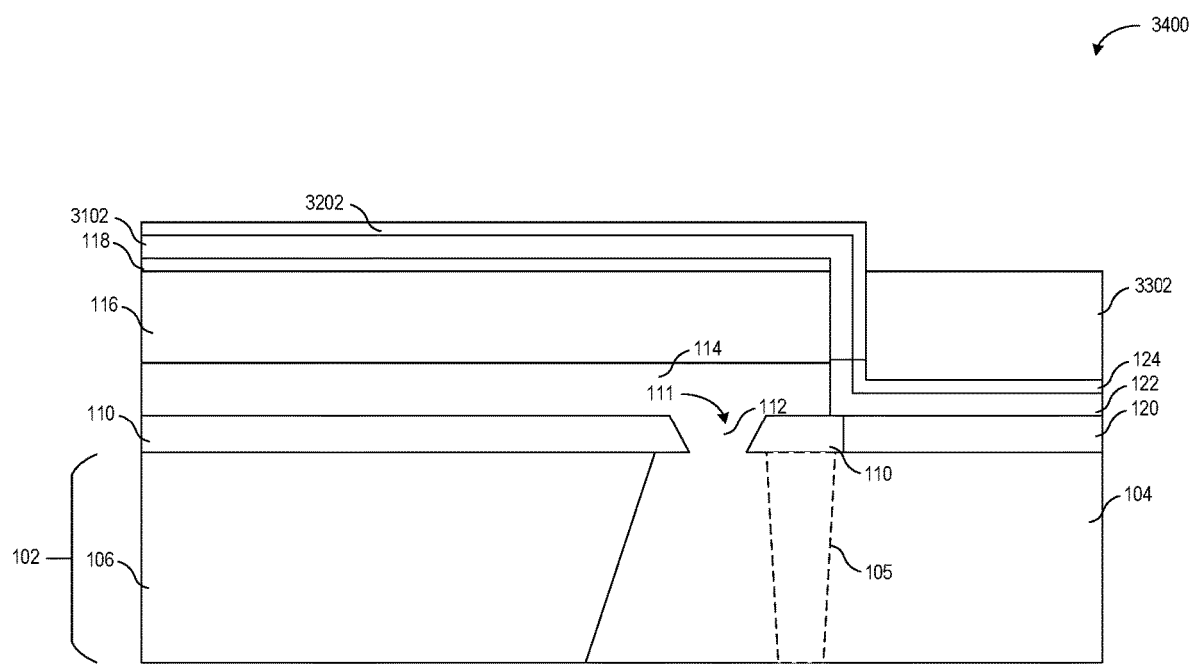

Referring to step 3008 and to FIG. 34, at a stage of fabrication 3400, a portion of the sacrificial material 3302 is removed. In one or more embodiments in which the sacrificial material 3302 includes dielectric material, the portion of the sacrificial material 3302 may be removed via an etch process, such as a wet etch process. In an embodiment, the sacrificial material 3302 may include oxide material, and a buffered oxide etch (BOE) process (e.g., using hydrofluoric acid (HF) as an etchant) or RIE process may remove the portion of the sacrificial material 3302. In one or more other embodiments in which the sacrificial material 3302 includes photoresist material, the portion of the sacrificial material 3302 may be removed via a photolithographic process (e.g., selective exposure of the photoresist material to ultraviolet light and subsequent removal of the portion of the sacrificial material 3302 using alkaline media or a solvent such as a photoresist stripper) or RIE process. Upon removal of the portion of the sacrificial material 3302, an upper surface of the second polycrystalline semiconductor layer 3202 is exposed and the remaining portion of the sacrificial material 3302 covers the emitter cap layer 124.

Figure 35:
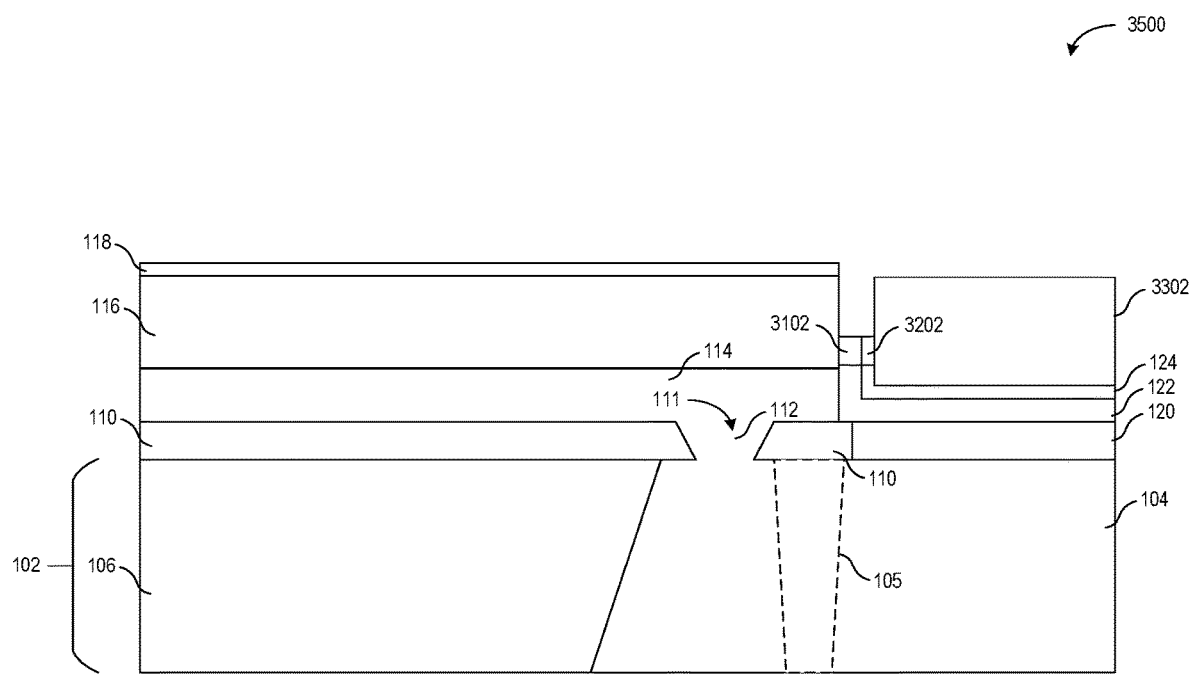

Referring to step 3010 and to FIG. 35, at a stage of fabrication 3500, portions of the first and second polycrystalline semiconductor layers 3102 and 3202 (including those portions exposed via removal of the portion of the sacrificial material 3302 at the stage of fabrication 3400 and step 3008, for example) may be removed via an etch process. For example, the etch process used to remove the portions of the first and second polycrystalline semiconductor layers 3102 and 3202 may include a chemical wet etch process, a RIE process, or another suitable etch process. As shown, some portions of the first and second polycrystalline semiconductor layers 3102 and 3202 are not removed by the etch process and may remain over the intrinsic base region 122 and the emitter cap layer 124, such that the intrinsic base region 122 and emitter cap layer 124 are protected during the etch process. This may prevent or mitigate undesired overetching that may otherwise undesirably remove portions of the intrinsic base region 122 and emitter cap layer 124 when removing the portions of the first and second polycrystalline semiconductor layers 3102 and 3202 at the stage of fabrication 3500 and the step 3010.

Figure 36:
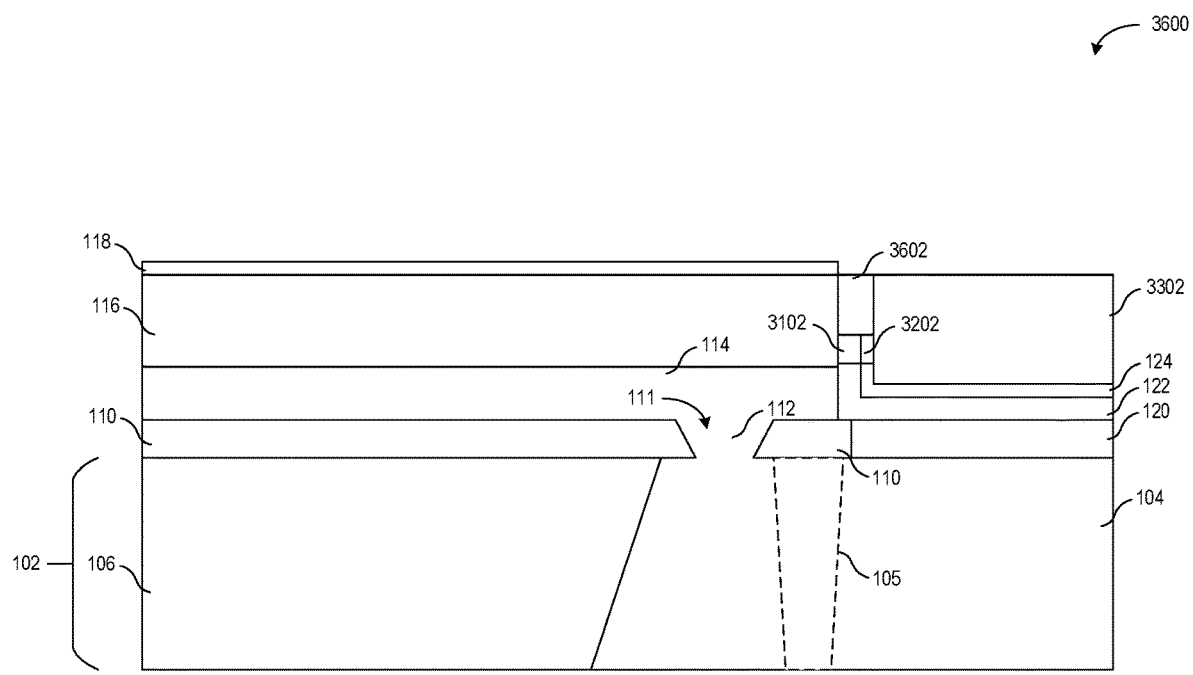

Referring to step 3012 and to FIG. 36, at a stage of fabrication 3600, nitride material 3602 is formed over the remaining portions of the first and second polycrystalline semiconductor layers 3102 and 3202 and between the sacrificial material 3302 and the oxide layer 116. For example, the nitride material 3602 may cover a sidewall of the oxide layer 116. In this way, the nitride material 3602 may protect at least the sidewall of the oxide layer 116 during subsequent removal of the sacrificial material 3302 (e.g., at step 3014 and/or the stage of fabrication 3700 of FIG. 7). For example, in one or more embodiments in which the sacrificial material 3302 includes oxide material, chemicals (e.g., HF or another suitable oxide etchant) used to remove the remaining portion of the sacrificial material 3302 would likely undesirably remove (etch) portions of the oxide layer 116, if not for protection of the oxide layer 116 by the nitride material 3602 and the nitride layer 118.

It should be noted that the use of nitride material 3602 to protect the oxide layer 116 in the present example is intended to be illustrative and not limiting. In one or more other embodiments, material other than nitride (e.g., aluminum fluoride ($AlF_3$), photoresist or alternative organic materials or another suitable dielectric material having a slower etch rate than the oxide layer 116 with respect to the etch process used to remove the sacrificial material 3302) may instead be formed covering the sidewall of the oxide layer 116 in place of the nitride material 3602 to protect the oxide layer 116 during subsequent removal of the sacrificial material 3302.

In one or more embodiments in which the sacrificial material 3302 includes photoresist material, the step 3012 and the stage of fabrication 3600 may be omitted, since it may not be necessary to protect the remaining portions of the when subsequently removing the sacrificial material 3302 using solvents, alkaline media, ashing/plasma stripping or other suitable photoresist stripper chemicals, since such materials typically do not remove or damage oxide material such as that of the oxide layer 116 or top surface of 124. In such embodiments, the nitride material 3602 is, therefore, not formed over the remaining portions of the first and second polycrystalline semiconductor layers 3102 and 3202 and adjacent to the oxide layer 116.

Figure 37:
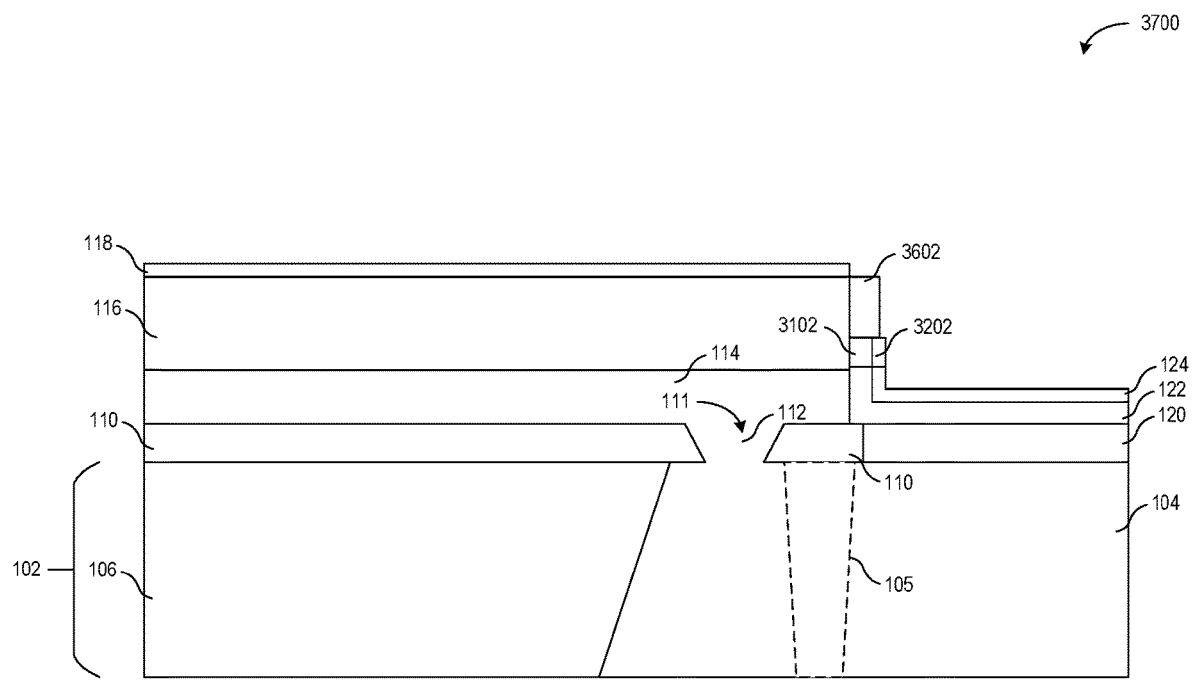

Referring to step 3014 and to FIG. 37, at a stage of fabrication 3700, the remaining portion of the sacrificial material 3302 is removed. In one or more embodiments in which the sacrificial material 3302 includes oxide material, the sacrificial material 3302 may be removed using a chemical wet etch process, such as a BOE process. In one or more embodiments in which the sacrificial material 3302 includes photoresist material, the sacrificial material 3302 may be removed using a solvent, alkaline media, or other photoresist stripper.

Figure 38:
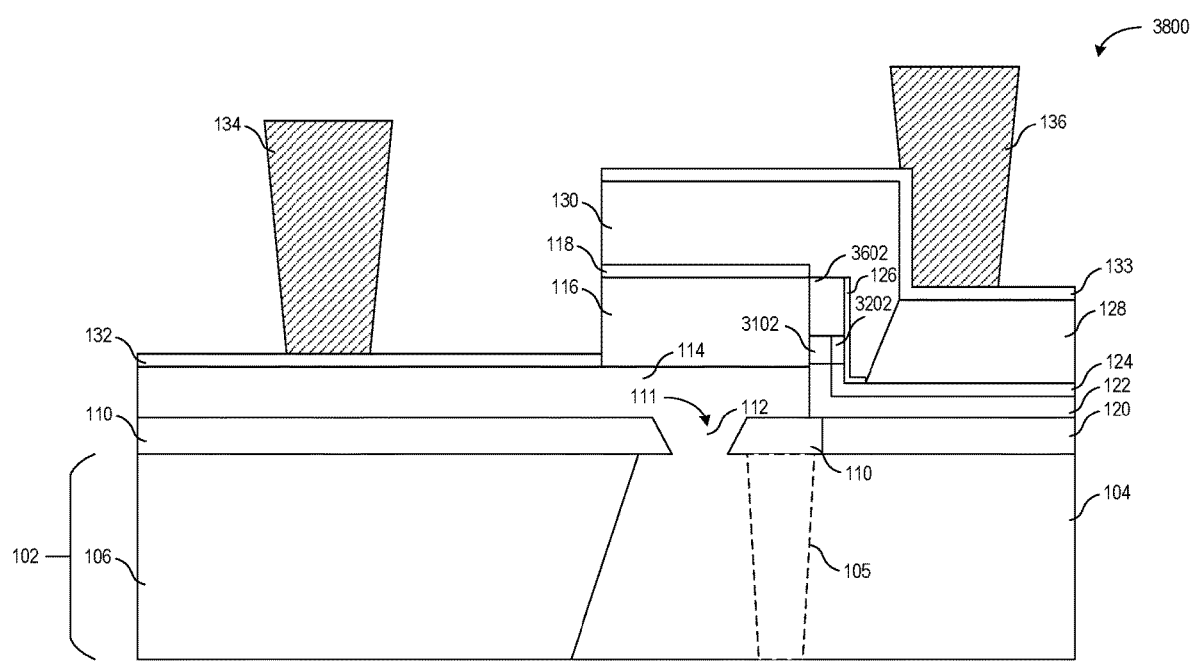
FIG. 38 is a cross sectional side view of a transistor device fabricated using the method of FIG. 30 and the stages of fabrication of FIGS. 31-37, in accordance with various embodiments.

FIG. 38 shows a cross-sectional side view of a transistor device 3800, according to an embodiment. In some embodiments, the transistor device 3800 may be fabricated, at least in part, using the method 3000 of FIG. 30 and/or the steps of fabrication 3100, 3200, 3300, 3400, 3500, 3600, and/or 3700 of FIGS. 31-37. As shown, the remaining portions of the first and second polycrystalline semiconductor layers 3102 and 3202 may be disposed over the intrinsic base region 122 and the emitter cap layer 124 and between the inside spacer 126 and the oxide layer 116. The nitride material 3602 may be disposed over the remaining portions of the first and second polycrystalline semiconductor layers 3102 and 3202 and between the inside spacer 126 and the oxide layer 116. As indicated previously, the nitride material 3602 may be omitted for one or more embodiments in which the sacrificial material 3302 included photoresist material. One or more other aspects or elements of the transistor device 3800 may be similar to those of the transistor device 101 of FIG. 1 and their descriptions are not repeated here for brevity.

It should be understood that, in addition to those processing steps described herein, other processing steps may be performed to complete any of the transistor devices 101, 2900, 3800 of FIGS. 1, 29, 38, including, but not limited to, the deposition and patterning of additional dielectric layers and/or metal layers.

As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method comprising:
   forming a first dielectric layer over a substrate that includes an isolation region and a collector region of a transistor device;
   forming an opening in the first dielectric layer to expose a portion of an upper surface of the collector region;
   forming a monocrystalline semiconductor layer over the first dielectric layer and in the opening;
   forming a second dielectric layer and a third dielectric layer over the monocrystalline semiconductor layer;
   removing a first portion of the monocrystalline semiconductor layer and portions of the first, second, and third dielectric layers, wherein the first portion overlaps the collector region prior to removal of the first portion, wherein an extrinsic base region of the transistor device comprises a second portion of the monocrystalline semiconductor layer;
   forming an intrinsic base region of the transistor device by forming first semiconductor material over the collector region; and
   forming an emitter region of the transistor device by forming second semiconductor material over the intrinsic base region and a portion of the extrinsic base region.

2. The method of claim 1, wherein forming the monocrystalline semiconductor layer comprises:
   forming third semiconductor material over the first dielectric layer and in the opening;
   amorphizing the first semiconductor material to form an amorphized semiconductor layer;
   performing epitaxial regrowth of the amorphized semiconductor layer to produce the monocrystalline semiconductor layer; and
   increasing a thickness of the monocrystalline semiconductor layer via epitaxial growth.

3. The method of claim 2, wherein forming the intrinsic base region comprises:
   forming a launcher layer of fourth semiconductor material over the collector region adjacent to the first dielectric layer; and
   forming the first semiconductor material on the launcher layer.

4. The method of claim 3, wherein forming the first semiconductor material on the launcher layer comprises:
   forming the first semiconductor material on the launcher layer via selective epitaxial growth.

5. The method of claim 3, wherein forming the first semiconductor material on the launcher layer comprises:
   forming the first semiconductor material on the launcher layer via non-selective epitaxial growth.

6. The method of claim 3, wherein forming the emitter region comprises:
   forming a cap layer on the first semiconductor material via epitaxial growth; and
   forming the second semiconductor material on the cap layer and the third dielectric layer, wherein the second semiconductor material includes a monocrystalline portion formed on the cap layer and a polycrystalline portion formed on the third dielectric layer.

7. The method of claim 6, further comprising:
   forming an inside spacer over a portion of the cap layer and adjacent to the second and third dielectric layers, wherein the inside spacer comprises one or more layers of dielectric material separating the cap layer and the second dielectric layer from the polycrystalline portion of the second semiconductor material of the emitter region.

8. The method of claim 1, wherein the extrinsic base region is coupled to the collector region through the opening in the first dielectric layer.

9. The method of claim 1, wherein the substrate further comprises an additional isolation region that separates the collector region into first and second portions, wherein the first portion of the collector region is coupled to the extrinsic base region and the second portion of the collector region is coupled to the intrinsic base region.

10. The method of claim 1, wherein the opening is defined by substantially vertical sidewalls of the first dielectric layer.

11. The method of claim 1, wherein the extrinsic base region includes a silicon germanium superlattice.

12. A transistor device comprising:
    a substrate comprising a collector region and an isolation region;
    a first dielectric layer disposed over the substrate;
    an extrinsic base region disposed over the first dielectric layer, the extrinsic base region including monocrystalline semiconductor material, wherein the extrinsic base region is coupled to the collector region via an opening in the first dielectric layer;
    an intrinsic base region disposed adjacent to the extrinsic base region and over the collector region;
    an emitter region disposed over the intrinsic base region;
    a second dielectric layer disposed over the extrinsic base region;
    a third dielectric layer disposed over the second dielectric layer;
    an intrinsic emitter region that is disposed on the intrinsic base region and that is formed from monocrystalline semiconductor material; and
    an extrinsic emitter region that is disposed on the third dielectric layer and adjacent to the intrinsic emitter region and that is formed from polycrystalline semiconductor material.

13. The transistor device of claim 12, wherein:
    the extrinsic base region is formed from monocrystalline silicon,
    the intrinsic base region is formed from monocrystalline silicon germanium,
    the intrinsic emitter region is formed from monocrystalline silicon, and
    the extrinsic emitter region is formed from polycrystalline silicon.

14. The transistor device of claim 12, further comprising:
an inside spacer comprising one or more dielectric layers that separate the extrinsic emitter region from the second dielectric layer.

15. The transistor device of claim 12, further comprising:
a cap layer disposed between the intrinsic base region and the emitter region.

16. The transistor device of claim 12, further comprising:
a launcher layer formed from monocrystalline semiconductor material and disposed between the collector region and the intrinsic base region.

17. The transistor device of claim 12, wherein the opening is defined by substantially vertical sidewalls of the first dielectric layer.

18. A transistor device comprising:
a substrate comprising a collector region and an isolation region;
a first dielectric layer disposed over the substrate;
an extrinsic base region disposed over the first dielectric layer, the extrinsic base region including monocrystalline semiconductor material, wherein the extrinsic base region is coupled to the collector region via an opening in the first dielectric layer;
an intrinsic base region disposed adjacent to the extrinsic base region and over the collector region; and
an emitter region disposed over the intrinsic base region, wherein the substrate further comprises:
an additional isolation structure that divides the collector region into first and second portions, wherein the first portion of the collector region is coupled to the extrinsic base region via the opening in the first dielectric layer and the second portion of the collector region is coupled to the intrinsic base region.

* * * * *